United States Patent
Uchida

(10) Patent No.: US 6,960,846 B2
(45) Date of Patent: Nov. 1, 2005

(54) LINEAR PULSE MOTOR, STAGE APPARATUS, AND EXPOSURE APPARATUS

(75) Inventor: Shinji Uchida, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 23 days.

(21) Appl. No.: 10/756,509

(22) Filed: Jan. 14, 2004

(65) Prior Publication Data

US 2004/0222705 A1 Nov. 11, 2004

Related U.S. Application Data

(62) Division of application No. 10/100,089, filed on Mar. 19, 2002, now Pat. No. 6,853,099.

(30) Foreign Application Priority Data

Mar. 19, 2001 (JP) ........................................ 2001-078259
Jul. 6, 2001 (JP) ........................................ 2001-206499

(51) Int. Cl.⁷ ............................................. H02K 41/00
(52) U.S. Cl. ...................................................... 310/12
(58) Field of Search ........................ 310/12–14; 318/135

(56) References Cited

U.S. PATENT DOCUMENTS

| | | | |
|---|---|---|---|
| 3,881,139 A | 4/1975 | Inaba et al. | 318/28 |
| 4,774,442 A * | 9/1988 | Teramachi | 318/135 |
| 4,810,914 A | 3/1989 | Karidis et al. | 31/12 |
| 4,945,268 A | 7/1990 | Nihei et al. | 310/12 |
| 5,010,262 A * | 4/1991 | Nakagawa et al. | 310/12 |
| 5,179,304 A * | 1/1993 | Kenjo et al. | 310/12 |
| 5,196,745 A | 3/1993 | Trumper | 310/12 |
| 5,808,382 A | 9/1998 | Ira et al. | 310/12 |
| 6,069,417 A | 5/2000 | Yuan et al. | 310/12 |
| 6,259,174 B1 * | 7/2001 | Ono | 310/13 |
| 6,262,503 B1 | 7/2001 | Liebman et al. | 310/64 |
| 6,339,269 B1 | 1/2002 | Hsiao | 310/64 |

FOREIGN PATENT DOCUMENTS

| | | |
|---|---|---|
| JP | 1-103152 | 4/1989 |
| JP | 10-97966 | 4/1998 |

* cited by examiner

Primary Examiner—Darren Schuberg
Assistant Examiner—Judson H. Jones
(74) Attorney, Agent, or Firm—Fitzpatrick, Cella, Harper & Scinto

(57) ABSTRACT

A linear pulse motor includes primary stators (1) in which a plurality of excitation units (3a–3d) and excitation coils (5a–5d) wound on the excitation coils are lined up in a row, and a secondary movable element (12) arranged at a predetermined gap from the stators (1) to face side surfaces of the stators (1). The stators (1) are arranged in a traveling direction of the movable element (12), and the stators (1) and the movable element (12) are supported to be movable relative to each other in the traveling direction of the movable element (12). A plurality of pole teeth (16) arranged on the movable element (12) are partitioned and integrally connected to each other by a nonmagnetic member (17). The secondary movable element is made lightweight and the response performance is improved.

32 Claims, 16 Drawing Sheets

FIG. 14

URL  http://www.maintain.co.jp/db/input.html

TROUBLE DB INPUT WINDOW

| | | |
|---|---|---|
| OCCURRENCE DATE | 2000/3/15 | ~404 |
| TYPE OF APPARATUS | ********** | ~401 |
| OBJECT | OPERATION ERROR (START-UP ERROR) | ~403 |
| DEVICE S/N | 465NS4580001 | ~402 |
| DEGREE OF URGENCY | D | ~405 |
| SYMPTOM | LED KEEPS FLICKERING AFTER POWER ON | ~406 |
| REMEDY | POWER ON AGAIN (PRESS RED BUTTON IN ACTIVATION) | ~407 |
| PROGRESS | INTERIM HAS BEEN DONE. | ~408 |

[SEND] [RESET]   410                    411                412
              LINK TO RESULT LIST DATABASE   SOFTWARE LIBRARY   OPERATION GUIDE

SEMICONDUCTOR DEVICE MANUFACTURING FLOW

LINEAR PULSE MOTOR, STAGE APPARATUS, AND EXPOSURE APPARATUS

This is a divisional application of U.S. patent application Ser. No. 10/100,089, filed on Mar. 19, 2002 now U.S. Pat. No. 6,853,099.

FIELD OF THE INVENTION

The present invention relates to a variable reactance linear pulse motor (to be referred to as a VR linear pulse motor hereinafter) and, more particularly, to a linear pulse motor used by a driving system for an FA device which requires a high thrust and sharp acceleration and deceleration as driving performance, and a driving system for a semiconductor-related apparatus which is apt to be easily damaged by heat generation and cogging (fluctuations in thrust when no voltage is applied) and which requires a good response to sharp acceleration and deceleration, and a stage apparatus and exposure apparatus using the linear pulse motor.

BACKGROUND OF THE INVENTION

An example of a two-sided linear pulse motor conventionally used in an FA device or exposure apparatus includes a 4-phase linear pulse motor with an arrangement as shown in FIG. 4. Referring to FIG. 4, first and second primary stators 1 are arranged to sandwich a secondary movable element 2. Excitation units 3a, 3b, 3c, and 3d respectively classified in A, B, C, and D phases and made of a magnetic material are arranged along the traveling direction of the secondary movable element 2. The excitation units 3a, 3b, 3c, and 3d respectively have excitation coils 4a, 4b, 4c, and 4d wound around them, and projecting primary stator pole teeth 5a, 5b, 5c, and 5d each formed at least one on their respective surfaces opposing the secondary movable element 2.

The secondary movable element 2 has a secondary movable element yoke 6 extending continuously in the traveling direction of the secondary movable element 2, and a plurality of secondary movable element pole teeth 2a arranged on the two side surfaces of the secondary movable element yoke 6 to oppose the primary stators 1. The secondary movable element 2 is supported to be movable in the traveling direction of the secondary movable element 2 with respect to the primary stators 1. To drive the secondary movable element 2, power is supplied to the 4-phase excitation coils 4a, 4b, 4c, and 4d in a certain order so the excitation units 3a, 3b, 3c, and 3d of the respective phases are excited. The secondary movable element 2 obtains a thrust in the traveling direction from a magnetic attracting force generated by the mutual magnetic functions of the movable element pole teeth 2a and stator pole teeth 5a to 5d.

In the conventional two-sided linear pulse motor described above, the secondary movable element 2 has the plurality of secondary movable element pole teeth 2a on those two side surfaces which oppose the first and second primary stators 1 from the secondary movable element yoke 6 extending in the traveling direction. Since the secondary movable element yoke 6 becomes large in size, the weight of the entire secondary movable element 2 increases, and the inertia of the movable element increases. Consequently, even when a control command for sharp acceleration/deceleration is supplied to the linear pulse motor, the linear pulse motor cannot reach the specified speed within a predetermined period of time, or cannot be decelerated to stop within a predetermined period of time. Namely, this linear pulse motor has a poor response performance, i.e., a poor accelerating/decelerating performance.

As a conventional VR linear pulse motor, for example, a 4-phase linear pulse motor as shown in FIG. 10 is available. In this linear pulse motor, a movable element 11 has magnetic portions 13a, 13b, 13c, and 13d respectively classified in A, B, C, and D phases and formed along the traveling direction of the movable element 11, coils 14a, 14b, 14c, and 14d wound around the corresponding magnetic portions, and projecting movable element pole teeth 15a, 15b, 15c, and 15d each formed at least one on that surface of the movable element 11 which opposes a stator 60. The movable element 11 is supported to be movable with respect to the stator 60. The stator 60 has a plurality of stator pole teeth 12a on one side surface of a stator yoke 20 which opposes the movable element pole teeth 15a to 15d. To drive the movable element 11, power is supplied to the 4-phase excitation coils 14a to 14d in a certain order so the excitation units 13a, 13b, 13c, and 13d of the respective phases are excited. The movable element 11 obtains a thrust in the traveling direction from a magnetic attracting force generated by the mutual magnetic functions of the movable element pole teeth 15a to 15d and stator pole teeth 12a. In this case, assume that when power is supplied to the coil 14a, 14b, 14c, or 14d, this is called A-, B-, C-, or D-phase excitation.

The conventional excitation method includes three types of excitation, i.e., 1-phase excitation, 2-phase excitation, and 1–2-phase excitation. In the following description, the thrust generating principle will be explained by using 1-phase excitation as an example, and its problems will be discussed. In 1-phase excitation, the excitation phase is switched in the order of A phase→B phase→C phase→D phase→A phase, and during this excitation switching, the movable element can travel for 1 pitch P in the traveling direction. FIGS. 11A to 11C show how the movable element travels for ¼ pitch. P (pitch) mentioned here refers to the distance from a stator pole tooth to an adjacent stator pole tooth.

First, the movable element is energized in the A phase, so it forms a main magnetic circuit (broken line) as shown in FIG. 11A and maintains a stable state at this position. A stable state means a state wherein a thrust generated by the magnetic attracting force caused between the movable element pole teeth 15b and 15d and the stator pole teeth 12a upon A-phase excitation is balanced in the traveling direction. When excitation phase is switched from the A phase to the B phase, concerning the main magnetic circuit to be formed, in addition to the one which forms in the order of the magnetic portion 13b→magnetic portion 13a→movable element pole tooth 15a→stator pole tooth 12a→stator yoke 20→stator pole tooth 12a→movable element pole tooth 15b→magnetic portion 13b, the one which forms in the order of the magnetic portion 13b→magnetic portion 13d→movable element pole tooth 15d→stator pole tooth 12a→stator yoke 20→stator pole tooth 12a→movable element pole tooth 15b→magnetic portion 13b (FIG. 11B) is obtained. Of the magnetic fluxes that pass through the magnetic portions 13a, 13b, 13c, and 13d, the maximum one is that of the magnetic portion 13b. Regarding the thrust generated when the movable element pole teeth receives a magnetic attracting force from the stator pole teeth, in relation to the positions of the movable element pole teeth and stator pole teeth relative to each other, the thrust is zero in the movable element pole tooth 15a, a large leftward thrust is generated in the movable element pole tooth 15b, and a small rightward thrust is generated in the movable element pole tooth 15d. Accordingly, the movable element becomes unstable. Upon obtaining the rightward thrust, the movable element 11 moves to a position where the leftward and rightward thrusts are balanced, as shown in FIG. 11C. After this, the C, D, and A phases are excited sequentially.

A thrust is generated in the linear pulse motor, while the opposing movable element pole teeth and stator pole teeth are displaced from each other in the traveling direction, when a magnetic flux flows from one pole tooth to an opposing pole tooth through the gap and the stator pole teeth supplies a magnetic attracting force to the movable element pole teeth. In the conventional linear pulse motor, concerning the magnetic circuit shown in FIG. 11B, the magnetic flux generated by B-phase excitation passes between the movable element and stator through the gap at the portions of the movable element pole teeth 15a, 15b, 15c, and 15d. However, the magnetic flux that actually contributes to generation of the thrust generates a thrust only in the movable element pole tooth 15b. In the movable element pole teeth 15a and 15d, the magnetic flux does not generate a thrust, or generates a thrust in a direction opposite to the traveling direction. When a gap is present in the magnetic circuit, a magnetic resistance is present accordingly, and a magnetomotive force by excitation is necessary. When a gap that does not generate a thrust or a gap that generates a thrust in a direction opposite to the traveling direction is present in the magnetic circuit, a magnetomotive force is necessary accordingly, and the conversion efficiency from the magnetomotive force into the thrust becomes poor.

SUMMARY OF THE INVENTION

The present invention has been proposed to solve the conventional problems, and has as its object to provide a linear pulse motor with a high acceleration/deceleration and a high response performance, in which the mass of a secondary movable element yoke is minimized so a lightweight secondary movable element is formed.

It is another object of the present invention to provide a high-thrust or high-efficiency linear pulse motor that efficiently utilizes a magnetic flux passing through a gap. An important point in solving the above problems is to form a closed magnetic circuit, so the magnetic flux is prevented from flowing to a magnetic portion and pole teeth that do not contribute to generation of the thrust.

It is still another object of the present invention to improve, in a conventional variable reactance linear pulse motor (to be referred to as a VR linear pulse motor hereinafter) which obtains a thrust from a change rate of the magnetic resistance, a magnetic circuit by using both magnetic portions and nonmagnetic portions, thereby providing a high-thrust, high-efficiency linear pulse motor.

In order to achieve the above objects, a linear pulse motor according to the present invention comprises primary stators in which a plurality of magnetic members and excitation coils wound on the magnetic members are lined up in a row, and a secondary movable element arranged at a predetermined air gap from the stators to face side surfaces thereof, the stators being arranged in a traveling direction of the movable element, and the stators and the movable element being supported to be movable in the traveling direction relative to each other, wherein a plurality of pole teeth arranged on the movable element are partitioned and integrally connected to each other by a nonmagnetic member that forms the movable element, thereby forming the movable element.

Preferably, the linear pulse motor has a two-sided structure in which the stators are arranged on two sides of the movable element.

Preferably, in the linear pulse motor, the movable element is guided and supported by either one of a static pressure bearing and a magnetic bearing to be movable in the traveling direction.

Preferably, the linear, pulse motor comprises at least either one of cooling means for cooling the excitation coils and cooling means for cooling the movable element.

Preferably, in the linear pulse motor, the magnetic members used by at lease either one of the stators and the movable element are laminated electromagnetic steel plates.

Preferably, in the linear pulse motor, the nonmagnetic material used by at least either one of the primary stators and the secondary movable element is either one of stainless steel, aluminum, a ceramic material, and a resin.

A stage apparatus according to the present invention comprises a control unit for generating a driving control command for a driving element, and the above linear pulse motor for driving a stage on the basis of the driving control command generated by the control unit.

An exposure apparatus according to the present invention comprises the above stage apparatus for mounting a wafer thereon and positioning the wafer at an exposure position.

With the above arrangement, in a two-sided linear pulse motor, the mass of the secondary movable element yoke is minimized, and the pole teeth are integrally connected to each other with a nonmagnetic member, so a lightweight secondary movable element can be formed. Accordingly, a high response performance that can be controlled even with a sharp acceleration/deceleration can be achieved.

While the mass of the secondary movable element yoke is minimized, the magnetic circuit in motor driving is not altered at all, and the thrust of the motor does not decrease at all.

In order to achieve the above objects, a linear pulse motor according to the present invention comprises a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from the primary pole teeth with a secondary magnetic portion, the coil being energized to move the primary and secondary members relative to each other in one direction, wherein a first primary pole tooth, a second primary pole tooth located to be relatively displaced from the first primary pole tooth by a pitch P in one direction, a first primary magnetic portion for connecting the first and second primary pole teeth to each other, and a coil wound on the first primary magnetic portion make up an excitation unit, the primary member having a group of excitation units including n excitation units arranged to be relatively displaced from each other by P/n in one direction where n is an integer of not less than 3, and the primary and secondary members are supported to be movable relative to each other in one direction.

In order to achieve the above objects, a linear pulse motor according to the present invention comprises a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from the primary pole teeth with a secondary magnetic portion, the coil being energized to move the primary and secondary members relative to each other in one direction, wherein a first secondary pole tooth, a second secondary pole tooth located to be relatively displaced from the first secondary pole tooth by a pitch P in one direction, and a first secondary magnetic portion for connecting the first and second secondary pole teeth to each other make up a pole tooth unit, the secondary member having a group of pole tooth units including n pole tooth units arranged to be relatively displaced from each other by P/n in one direction where n is an integer of not less than 3, and the primary and secondary members are supported to be movable relative to each other in one direction.

Preferably, in the linear pulse motor, the n pole tooth units are connected to each other with nonmagnetic portions.

Preferably, in the linear pulse motor, n=3, and the secondary member has a group of pole tooth units including three pole tooth units arranged to be relatively displaced from each other by P/3 in one direction.

Preferably, in the linear pulse motor, n=4, and the secondary member has a pole tooth unit including four pole tooth units arranged to be relatively displaced from each other by P/4 in one direction.

Preferably, in the linear pulse motor, a nonmagnetic portion of the secondary member is either one of stainless steel, aluminum, and a ceramic material.

Preferably, the linear pulse motor comprises cooling means for cooling the coil.

Preferably, in the linear pulse motor, the cooling means cools the secondary member.

Preferably, in the linear pulse motor, the magnetic portions used by the primary and secondary members are laminated electromagnetic steel plates.

In the linear pulse motor according to the present invention, the magnetic circuit formed by excitation is a closed circuit, so a magnetic flux is prevented from leaking to a magnetic portion that does not contribute to generation of a thrust, and a magnetic flux passing through a gap between the movable element pole tooth and stator pole tooth is utilized effectively, thereby achieving a high thrust or high efficiency.

In order to achieve the above objects, a stage apparatus according to the present invention comprises a control unit for generating a driving control command for a driving element, and the above linear pulse motor for driving a stage on the basis of the driving control command generated by the control unit.

In order to achieve the above objects, an exposure apparatus according to the present invention comprises the above stage apparatus for mounting a wafer thereon and positioning the wafer at an exposure position.

A semiconductor device manufacturing method according to the present invention has the steps of setting a group of manufacturing apparatuses for various types of processes including the above exposure apparatus at a semiconductor manufacturing factory, and manufacturing a semiconductor device in accordance with a plurality of processes using the group of manufacturing apparatuses.

Preferably, the above semiconductor device manufacturing method comprises the steps of: connecting the group of manufacturing apparatuses through a local area network; connecting the local area network and an external network outside the semiconductor manufacturing factory; data-communicating information on at least one of the group of manufacturing apparatuses from a database on the external network by utilizing the local area network and the external network; and controlling the exposure apparatus on the basis of the communicated information.

Preferably, in the above semiconductor device manufacturing method, maintenance information on the manufacturing apparatus is obtained by data communication by accessing a database provided by a vender or user of the exposure apparatus through the external network, or production management is performed by data communication with another semiconductor manufacturing factory through the external network.

Also, a semiconductor manufacturing factory according to the present invention has a group of manufacturing apparatuses for various types of processes including the above exposure apparatus, a local area network for connecting the group of manufacturing apparatuses, and a gateway for connecting the local area network and an external network outside the semiconductor manufacturing factory to allow information on at least one of the group of manufacturing apparatuses to data-communicate.

Also, a maintenance method for an exposure apparatus set at a semiconductor manufacturing factory according to the present invention includes the steps of preparing a database for accumulating information on maintenance of the exposure apparatus on an external network outside the factory where the above exposure apparatus is set, connecting the exposure apparatus to a local area network in the factory, and maintaining the exposure apparatus on the basis of the information accumulated in the database by utilizing the external network and the local area network.

Preferably, the exposure apparatus further comprises an interface to be connected to a network; a computer for executing network software that data-communicates maintenance information on the exposure apparatus through the network; and a display for displaying the maintenance information on the exposure apparatus communicated by the network software executed by the computer.

Preferably, in the exposure apparatus, the network software provides a user interface, connected to an external network outside a factory where the exposure apparatus is set and for allowing access to a maintenance database provided by a vender or user of the exposure apparatus, on the display, thereby enabling information to be obtained from the database through the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 14 is a view showing a practical example of user interface;

DETAILED DESCRIPTION OF THE PREFERRED EMBODIMENTS

Preferred embodiments of the present invention will now be described in detail in accordance with the accompanying drawings.

A two-sided linear pulse motor according to an embodiment of the present invention will be described in detail, together with the accompanying drawings, with reference to FIGS. 1, 2, and 3.

Figure 1:
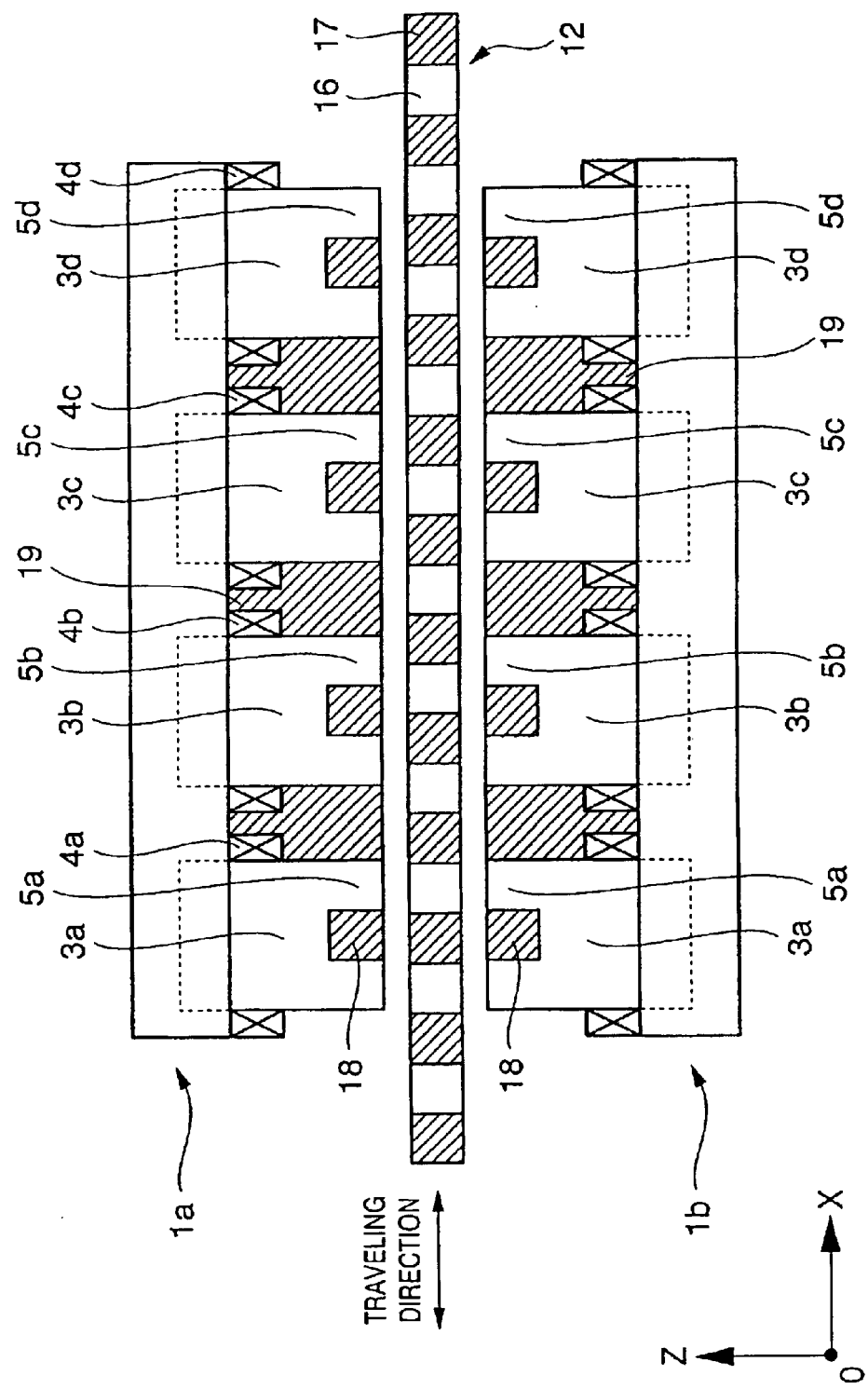
FIG. 1 is a view showing the schematic arrangement of a linear pulse motor according to the first embodiment of the present invention.

A two-sided linear pulse motor shown in FIG. 1 has first and second primary stators 1a and 1b and a secondary movable element 12. The first and second primary stators 1a and 1b are arranged on the two sides of the movable element 12 to be continuous in the traveling direction of the movable element 12, and has a plurality of excitation units 3a, 3b, 3c, and 3d arranged equidistantly along the traveling direction of the movable element 12 and a plurality of excitation coils 4a, 4b, 4c, and 4d respectively wound on the plurality of excitation units 3a, 3b, 3c, and 3d.

According to this embodiment, each of the excitation units 3a, 3b, 3c, and 3d serving as a magnetic member is made of laminated electromagnetic steel plates, and has two primary stator pole teeth 5 (5a, 5b, 5c, or 5d) on its surface which opposes the secondary movable element 2. The primary stator pole teeth 5 (5a, 5b, 5c, and 5d) are lined up in a row equidistantly at predetermined pitches. The first and second primary stators 1a and 1b are connected to each other so they do not move relative to each other.

The secondary movable element 12 is arranged between the first and second primary stators 1a and 1b in the traveling direction to oppose them through predetermined gaps. The secondary movable element 12 is supported by a static pressure bearing (not shown) such that it can move in the traveling direction relative to the primary stators 1a and 1b.

As shown in FIG. 1, the secondary movable element 12 has a plurality of secondary movable element pole teeth 16 corresponding to the primary stator pole teeth 5a, 5b, 5c, and 5d and lined up in a row equidistantly in the traveling direction at predetermined pitches. The two end faces of each of the plurality of secondary movable element pole teeth 16 face the primary stator pole tooth 5 on their two sides through predetermined gaps. In the secondary movable element 12, the plurality of secondary movable element pole teeth 16 are partitioned by and connected to each other by connecting members 17. Hence, the secondary movable element 12 is continuous in the traveling direction. The secondary movable element pole teeth 16 are made of a magnetic material such as carbon steel or silicon steel, and the connecting members 17 are made of a nonmagnetic material with a low magnetic permeability which is selected from, e.g., a ceramic material, stainless steel, aluminum, and a resin.

Similarly, the recesses between the pole teeth of the primary stators 1a and 1b are filled with a filler 18 made of a resin or the like, or are filled with preformed fillers 18 mounted in them. Spaces between the adjacent excitation units, adjacent excitation coils, and spaces between the excitation unit 3a and excitation coil 4a and between the excitation unit 3b and excitation coil 4b, and the like are filled with a filler 19 made of a resin or the like, or filled with preformed fillers 19 mounted in them.

Figure 2:
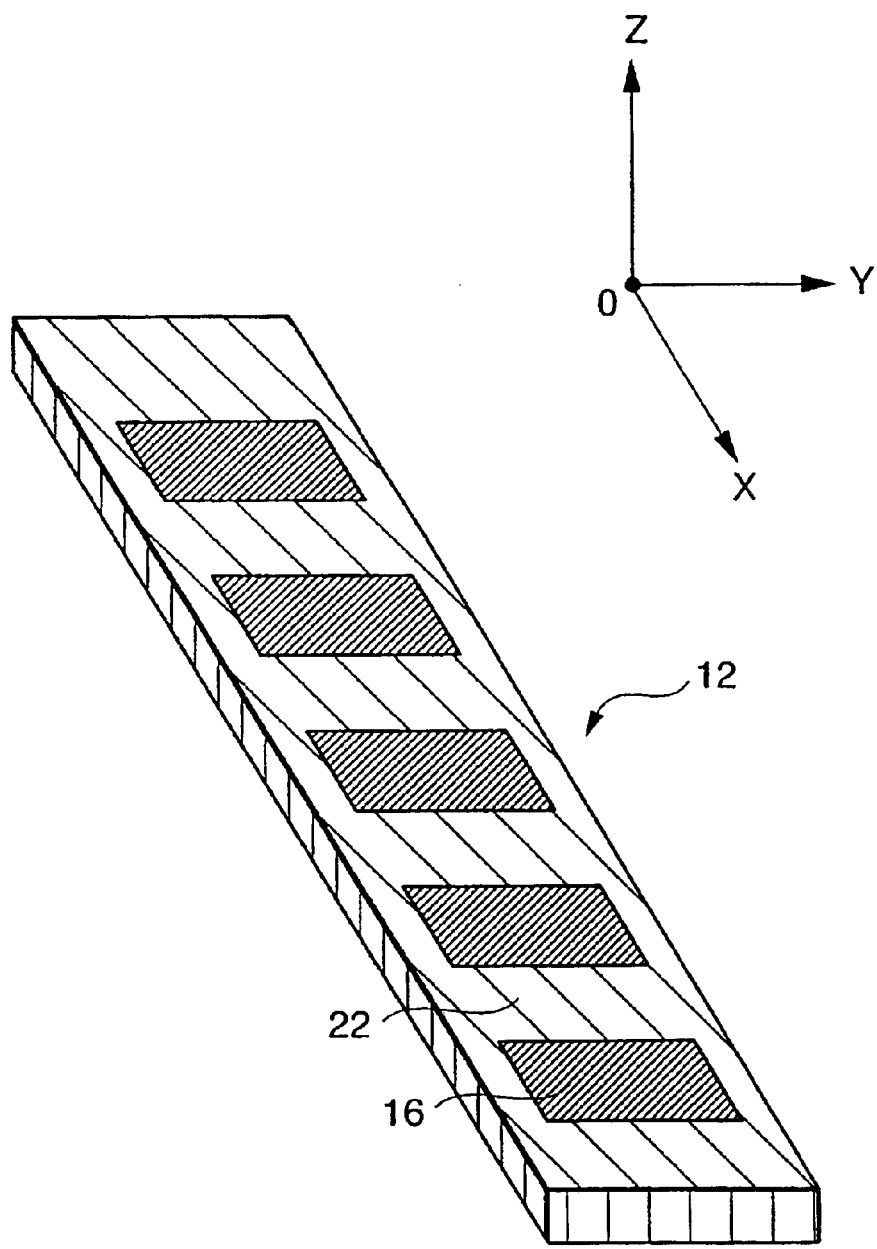
FIG. 2 is a perspective view showing the schematic arrangement of a movable element in the linear pulse motor according to the embodiment of FIG. 1.

The arrangement of the practical secondary movable element 12 according to the first embodiment is as shown in FIG. 2. A rectangular parallelepiped ceramic frame 22 serving as a nonmagnetic connecting member has holes with the shape of the secondary pole teeth, and the holes are filled with the secondary pole teeth 16 made of the magnetic material which are mounted in them.

Figure 3:
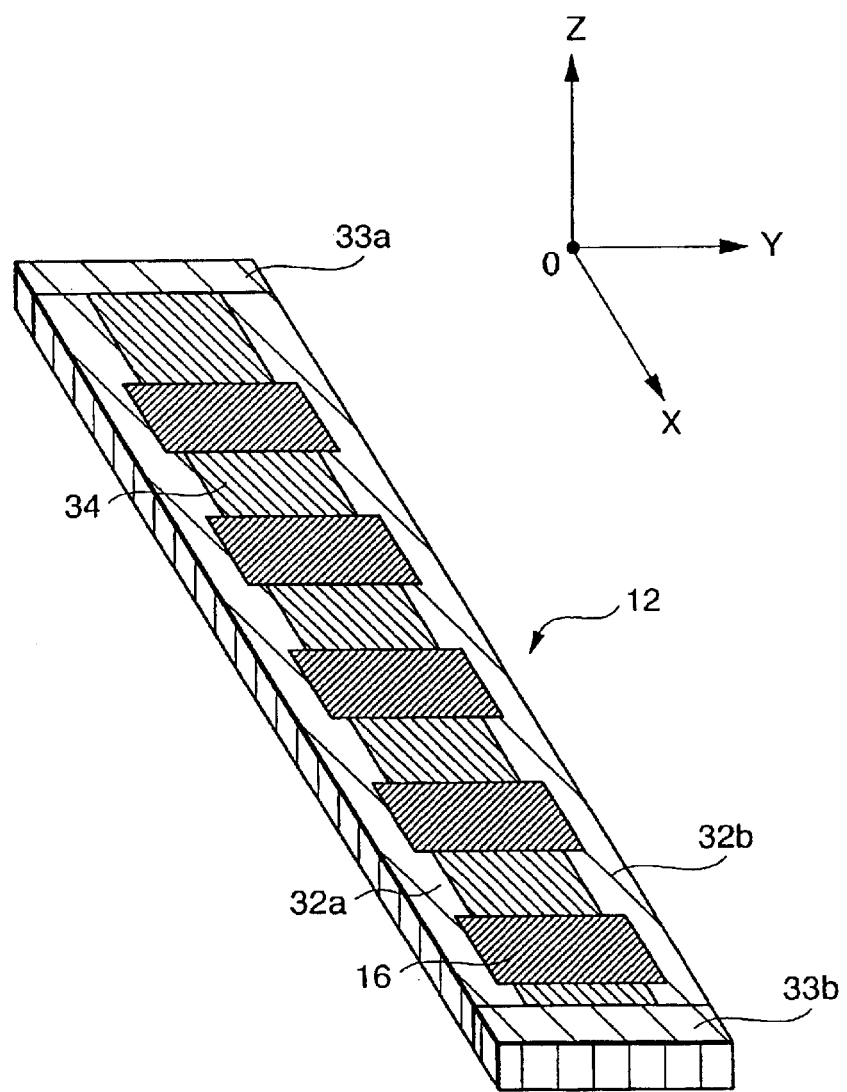
FIG. 3 is a perspective view showing another schematic arrangement of the movable element in the linear pulse motor according to the present invention.
Figure 4:
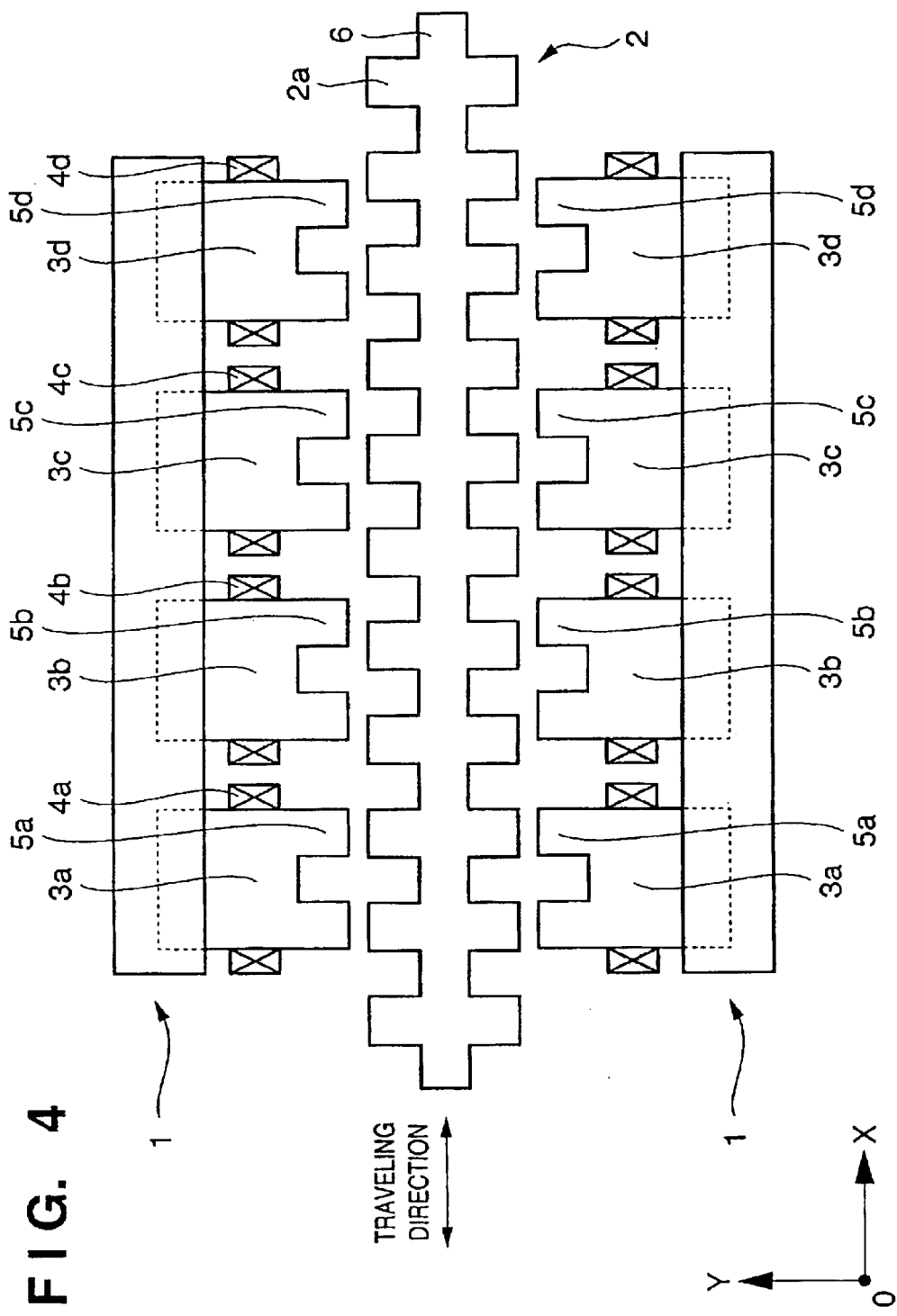
FIG. 4 is a view showing the schematic arrangement of a conventional linear pulse motor.
Figure 5:
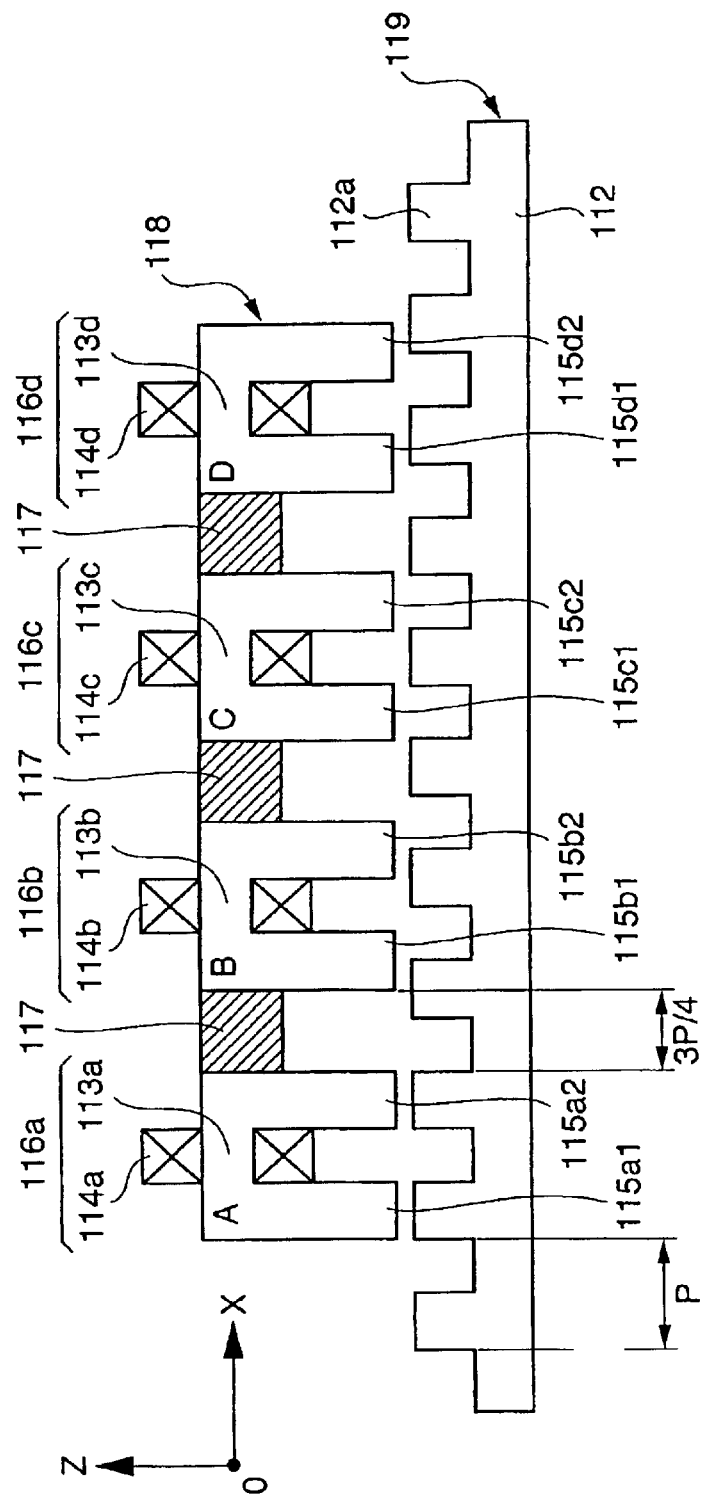
FIG. 5 is a view showing the schematic arrangement of a linear pulse motor according to the second embodiment of the present invention.

According to another arrangement of the secondary movable element 12, as shown in FIG. 3, secondary movable element pole teeth 16 lined up in the X direction are integrally connected to each other by sandwiching them from two sides in the Y direction with two ceramic frame members 32a and 32b extending continuously in the X direction and serving as nonmagnetic connecting members. The resultant structure is further fixed by two ceramic frame members 33a and 33b extending in the Y direction. Gaps or holes formed in the secondary movable element 12 in the Z direction are filled with a filler 34 made of a resin or the like, or are filled with preformed fillers 34 mounted in them. The recesses between the pole teeth of the primary stators 1 and spaces between adjacent excitation units and excitation coils are also filled with a filler made of a resin or the like, or are filled with preformed fillers mounted in them, in the same manner as described above. Those surfaces of the first and second primary stators 1a and 1b and secondary movable element 12 which oppose each other are smooth surfaces.

The filler can avoid entering a foreign substance such as chippings or dust between the primary stator pole teeth 5 (5a, 5b, 5c, or 5d) and secondary movable element pole teeth 16, so a decrease in motor efficiency which accompanies an increase in magnetic resistance due to entering of the foreign substance can be prevented.

In the static pressure bearing for supporting the secondary movable element 12, assume that air is supplied to the gaps formed by the first and second primary stators 1 (1a, 1b) and the secondary movable element 12, in order to guide and support the secondary movable element 12. In this case, the filler 34 fills the recesses and gaps, and the opposing surfaces of the first and second primary stators and secondary movable element form smooth surfaces, thereby increasing the air pressure in the gaps and accordingly increasing the support rigidity. To further increase the flatness, coating films may be formed on these opposing surfaces. The coating material may be a magnetic member such as nickel or a nonmagnetic material such as a resin.

When the plurality of pole teeth 5 and 16 which form the stators 1a and 1b and the movable element 12, respectively, and the yoke are formed of laminated steel plates, an eddy current loss can be decreased.

As described above, in the linear pulse motor, when the secondary movable element pole teeth 16 are integrally connected to each other with the nonmagnetic members, the secondary movable element 12 including the secondary movable element yoke can be made lightweight. The influence of inertial load caused by the self weight is excluded, so that a high response performance that follows sharp acceleration/deceleration control can be achieved.

While the mass of the secondary movable element yoke is minimized, the magnetic circuit in motor driving is not altered at all, and the thrust of the motor does not decrease at all.

The present invention is not limited to the structure indicated by the above embodiment. For example, the above embodiment describes a two-sided 4-phase linear pulse motor. However, the present invention is not limited to this but can be practiced by an n-phase linear pulse motor, and can be applied to a one-sided linear pulse motor as well. The driving method of the linear pulse motor is not limited, and can be a variable reactance method, a permanent magnet method, or a hybrid method. Also, the support mechanism for supporting the movable element can be a ball bearing or magnetic bearing, and the motor can be driven without using the filler described above.

<Second Embodiment>

An n-phase linear pulse motor and a 4-phase linear pulse motor according to the second embodiment of the present invention will be described, together with the accompanying drawings, with reference to FIG. 5, FIGS. 6A to 6C, and FIG. 7.

The 4-phase linear pulse motor according to the second embodiment is constituted by a movable element 118 serving as a primary member formed of an excitation unit group 116 consisting of a plurality of excitation units 116a, 116b, 116c, and 116d and nonmagnetic portions 117 for integrally connecting the excitation unit group 116, and a stator 119 serving as a secondary member having a plurality of projecting stator pole teeth 112a made of magnetic bodies formed at a predetermined gap from the excitation unit group 116 and a stator yoke 112 with the plurality of stator pole teeth 112a on its one side surface along the traveling direction. The movable element 118 is supported by a support mechanism (not shown) to be movable in the X direction. The plurality of excitation units 116a, 116b, 116c, and 116d are of the same shape and arrangement, and their arrangement will be described. For example, the excitation unit 116a has a first A-phase movable element pole tooth 115a1 opposing one stator side surface, where the stator pole teeth 112a are lined up, through a predetermined air gap, and a second A-phase movable element pole tooth 115a2 opposing the one stator side surface, where the stator pole teeth 112a are lined up, through a predetermined air gap and located to be relatively displaced from the A-phase movable element pole tooth 115a1 by a pitch P in the X direction. The distal ends of the movable element pole teeth 115a1 and 115a2 have end faces substantially parallel to the opposing stator side surface (distal ends of the stator pole teeth). Furthermore, an armature coil 114a is wound on an A-phase magnetic portion 113a that integrally connects the first and second A-phase movable element pole teeth 115a1 and 115a2 to each other.

The excitation unit 116b located adjacent to the excitation unit 116a to form a B-phase excitation unit with respect to it has a first B-phase movable element pole tooth 115b1 opposing one stator side surface, where the stator pole teeth 112a are lined up, through a predetermined air gap and located to be relatively displaced largely from the first A-phase movable element pole tooth 115a1 by P/4 in the X direction, and a second B-phase movable element pole tooth 115b2 opposing the one stator side surface, where the stator pole teeth 112a are lined up, through a predetermined air gap and located to be relatively displaced from the first B-phase movable element pole tooth 115b1 by the pitch P in the X direction. The distal ends of the B-phase movable element pole teeth 115b1 and 115b2 have end faces substantially parallel to the opposing stator side surface (distal ends of the stator pole teeth). An armature coil 114b is wound on a B-phase magnetic portion 113b that integrally connects the first and second B-phase movable element pole teeth 115b1 and 115b2 to each other.

Assume that 4-phase excitation driving is to be performed using four excitation units each with the above arrangement. In the following description, note that the respective excitation units will be called the A-, B-, C-, and D-phase excitation units 116a, 116b, 116c, and 116d in FIG. 5 and FIGS. 6A to 6C. As is apparent from the content described above and FIG. 5 and FIGS. 6A to 6C, the A-phase excitation unit 116a has the A-phase movable element pole teeth 115a1 and 115a2. Similarly, the B-phase excitation unit 116b has the B-phase movable element pole teeth 115b1 and 115b2, the C-phase excitation unit 116c has C-phase movable element pole teeth 115c1 and 115c2, and the D-phase excitation unit 116d has D-phase movable element pole teeth 115d1 and 115d2. Regarding the relative positional relationship among the respective movable element pole teeth 115a1, 115a2, 115b1, 115b2, 115c1, 115c2, 115d1, and 115d2, the pole teeth 115a and 115a2, 115b1 and 115b2, 115c1 and 115c2, and 115d1 and 115d2 are separated from each other by P. Regarding the relative positional relationship among the excitation units 116a, 116b, 116c, and 116d, the excitation units 116a and 116b, 116b and 116c, and 116c and 116d are connected to each other by interposing the nonmagnetic portions 117 each with a 3P/4-pitch width between them, so they are largely separated from each other with a distance larger than 2P by P/4.

Figure 6A:
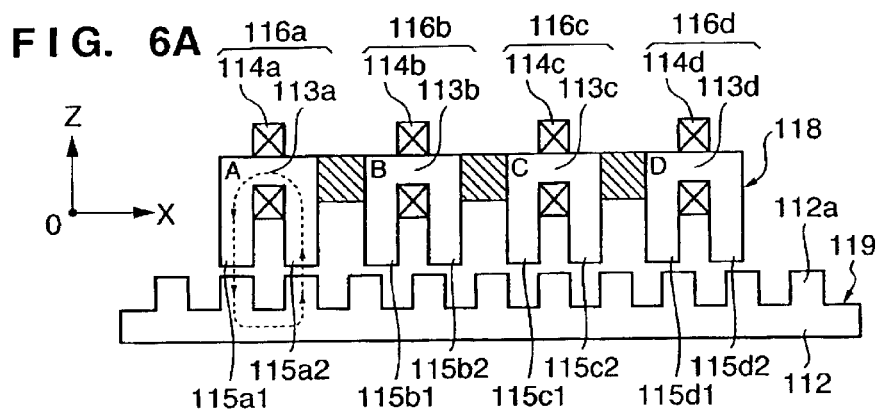
FIGS. 6A to 6C are views for explaining the basic operation of the linear pulse motor of the embodiment shown in FIG. 5.

In the above arrangement, the driving method of the linear pulse motor according to the present invention will be described with reference to FIGS. 6A to 6C. FIG. 6A shows a state wherein a current is supplied to the armature coil 114a and the movable element 118 is stabilized. In this stable state, the A-phase movable element pole teeth 115a1 and 115a2 face the corresponding stator pole teeth 112a. A magnetic flux generated by excitation flows, as indicated by the broken line of FIG. 6A, from the A-phase magnetic portion 113a into the A-phase movable element pole tooth 115a1, flows to the opposing stator pole tooth 112a through the gap, then flows to another adjacent stator pole tooth 112a via the stator yoke 112 to flow into the A-phase movable element pole tooth 115a2 through the air gap, and flows to the A-phase magnetic portion 113a, thus forming a main magnetic circuit. Although the A-phase movable element pole teeth 115a1 and 115a2 receive magnetic attracting forces from the stator pole teeth 12a they face, a thrust is not generated in the traveling direction.

Figure 6B:
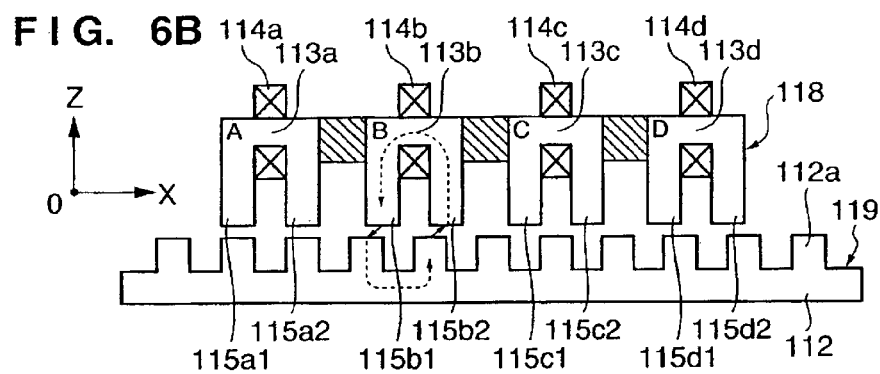
Figure 6C:
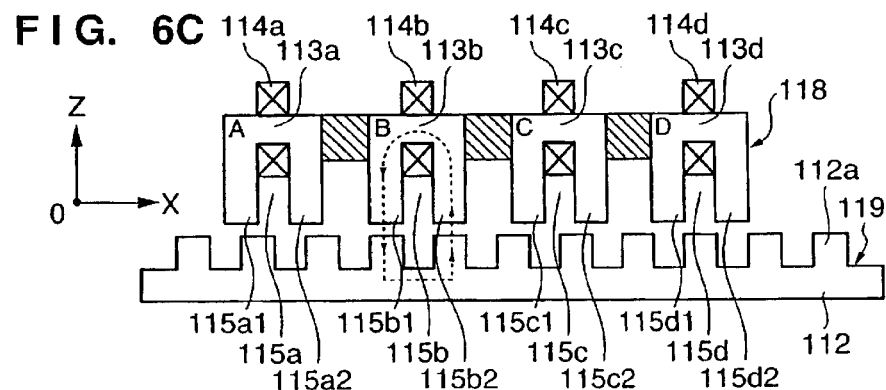

In this state, when supply of the current to the armature coil is switched from the armature coil 114a to the armature coil 114b, a main magnetic circuit as indicated by the broken line in FIG. 6B is formed. A magnetic flux generated by excitation flows from the B-phase magnetic portion 113*b* into the B-phase movable element pole tooth 115*b*1, flows to the opposing stator pole tooth 112*a* through the air gap, then flows to another adjacent stator pole tooth 112*a* via the stator yoke 112, to flow into the B-phase movable element pole tooth 115*b*2 through the air gap, and flows to the B-phase magnetic portion 113*b*. At this time, the B-phase movable element pole teeth 115*b*1 and 115*b*2 receive magnetic attracting forces of the same strengths and in the same direction from the stator pole teeth 12*a* which oppose them to be displaced from them by P/4 in the X direction, to generate thrusts of the same strength in the traveling direction. Because of these thrusts, the movable element 118 starts to move in the traveling direction from a state wherein the B-phase movable element pole teeth 115*b*1 and 115*b*2 oppose the corresponding stator pole tooth 112*a* to be displaced from them by P/4 in the X direction, to a state wherein the B-phase movable element pole teeth 115*b*1 and 115*b*2 face the corresponding stator pole tooth 112*a*. After this, similarly, supply of the current to the armature coil is sequentially switched to the armature coils 114*c*, 114*d*, 114*a*, and 114*b*, that is, the excitation phase is sequentially switched to the C, D, A, and B phases, to give a thrust in the traveling direction to the movable element, thus moving it.

Figure 7:
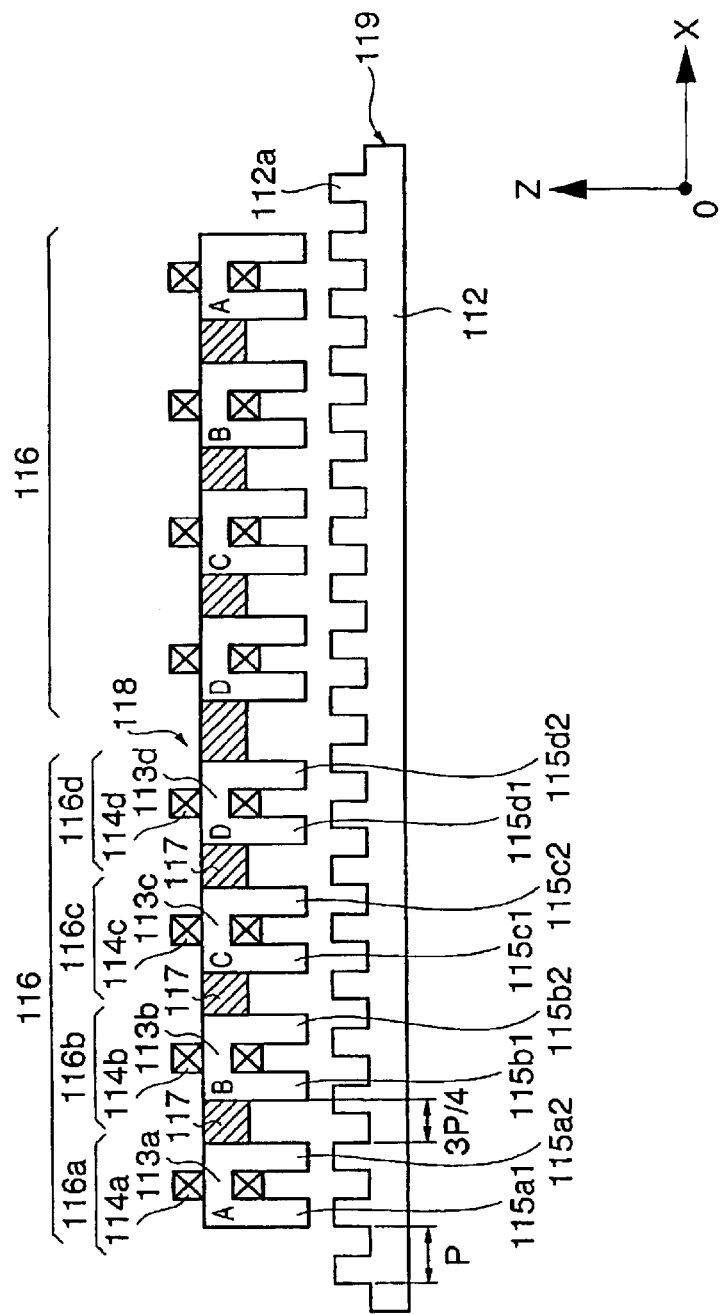
FIG. 7 is a view showing the arrangement of an application of the linear pulse motor according to the second embodiment of the present invention.

Although the 4-phase linear pulse motor having excitation units for the respective phases is described above, the present invention is not limited to this. As shown in FIG. 7, a 4-phase linear pulse motor having an excitation unit group 116 with A, B, C, and D phases as the excitation phases, and another excitation unit group 116 with A, B, C, and D phases as the excitation phases to be symmetric to the first excitation unit group 116 on an X plane perpendicular to the X-axis, can also be practiced. When the linear pulse motor is driven, the movable element 118 receives a Z-direction force from a magnetic attracting force supplied from the stator 119. With the arrangement in FIG. 7, the movable element can be driven without generating a moment, and a dynamic posture can be maintained at high precision.

As described above, in the arrangement of the linear pulse motor, both magnetic and nonmagnetic portions are employed to improve the magnetic circuit. Concerning the main magnetic circuit formed by excitation, the magnetic attracting force caused by the magnetic flux flowing between the movable element pole teeth and stator pole teeth can be entirely used to give a thrust to the movable element. Thus, an increase in thrust or efficiency of the linear motor can be achieved.

Although a 4-phase linear pulse motor is described in the above embodiment, the present invention is not limited to this, and can be practiced with an n-phase linear pulse motor. In driving the linear pulse motor, the movable element 118 may be fixed to serve as a stator, and the stator 119 may be made movable in the traveling direction so it serves as a movable element. Furthermore, the support mechanism for supporting the movable element can be either one of a ball bearing, a static pressure bearing, and a magnetic bearing.

<Third Embodiment>

Figure 8:
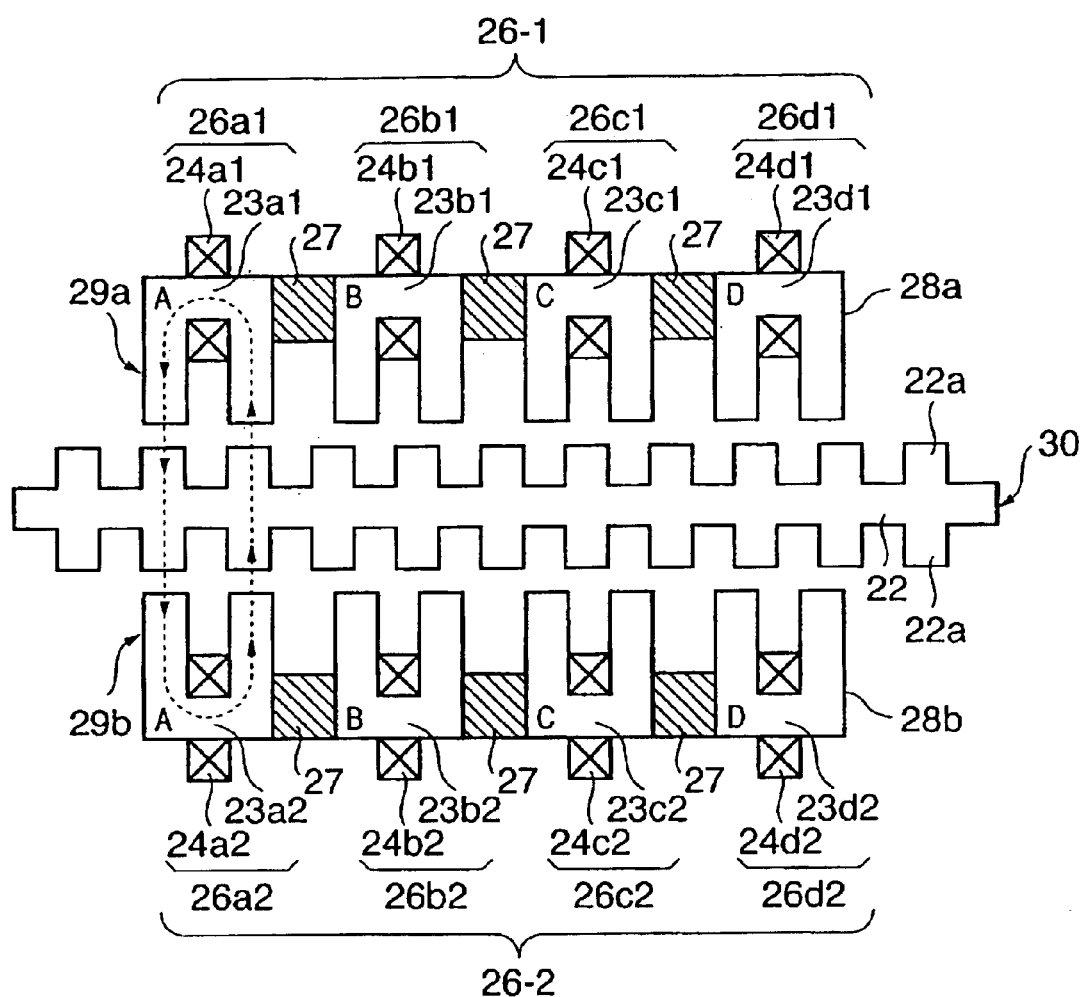
FIG. 8 is a view showing the schematic arrangement of a linear pulse motor according to the third embodiment of the present invention.

The third embodiment will be described with reference to FIG. 8. In a 4-phase linear pulse motor according to the third embodiment, an excitation unit group 26-1 including a plurality of excitation units 26*a*1, 26*b*1, 26*c*1, and 26*d*1, and an excitation unit group 26-2 including a plurality of excitation units 26*a*2, 26*b*2, 26*c*2, and 26*d*2 are arranged on the two sides of a stator 30. More specifically, this linear pulse motor has a one-side movable element member 28*a* formed of the excitation unit group 26-1 made up from the plurality of excitation units 26*a*1, 26*b*1, 26*c*1, and 26*d*1 and non-magnetic portions 27 for integrally connecting the excitation unit group 26-1 on one side of the stator 30, and the stator 30 having a plurality of projecting stator pole teeth 22*a* made of magnetic bodies and lined up in the traveling direction at a predetermined air gap from the excitation unit group 26-1, and a stator yoke 22 with the plurality of stator pole teeth 22*a* on its one side surface along the traveling direction.

The stator 30 has a plurality of the other-side projecting stator pole teeth 22*a* made of magnetic bodies, on the other side surface of the stator yoke 22 which opposes the one side surface, at positions identical to those of the one-side stator pole teeth 22*a* in the traveling direction. A movable element member 28*b* on the other side of the stator 30 and constituted by the other-side excitation unit group 26-2 made up from the plurality of excitation units 26*a*2, 26*b*2, 26*c*2, and 26*d*2 and the nonmagnetic portions 27 for integrally connecting the excitation unit group 26-2, has the same shape and arrangement as those of the movable element member 28*a*. In the same manner as the movable element member 28*a*, the movable element member 28*b* opposes the plurality of stator pole teeth 22*a* through a predetermined gap. Movable elements 29*a* and 29*b* respectively have the movable element members 28*a* and 28*b*, and pairs of excitation units 26*a*1 and 26*a*2, 26*b*1 and 26*b*2, 26*c*1 and 26*c*2, and 26*d*1 and 26*d*2 are integrally connected to each other such that they are at identical positions in the traveling direction.

The movable elements 29*a* and 29*b* are supported by a support mechanism (not shown) to be movable in the X direction, so the gaps formed by the distal ends of the movable pole teeth of the movable element members 28*a* and 28*b* and the gaps formed by the distal ends of the stator pole teeth always have the same widths.

In this embodiment, the plurality of excitation units 26*a*1, 26*b*1, 26*c*1, and 26*d*1 on one side (e.g., on the movable element 29*a* side) and the plurality of excitation units 26*a*2, 26*b*2, 26*c*2, and 26*d*2 on the other side (e.g., on the movable element 29*b* side) have the same shape and arrangement. The arrangement in which the plurality of excitation units 26*a*1, 26*b*1, 26*c*1, and 26*d*1 on one side are integrally connected and the arrangement in which the plurality of excitation units 26*a*2, 26*b*2, 26*c*2, and 26*d*2 on the other side are integrally connected to each other are identical to the arrangement described in the second embodiment in which the excitation units 116*a*, 116*b*, 116*c*, and 116*d* are integrally connected to each other.

According to an example of 4-phase excitation driving using 8 excitation units with an arrangement as described above, the excitation unit 26*a*1 on the movable element 29*a* side and the excitation unit 26*a*2 on the movable element 29*b* side form an A-phase excitation unit, and similarly the excitation units 26*b*1 and 26*b*2 form a B-phase excitation unit, the excitation units 26*c*1 and 26*c*2 form a C-phase excitation unit, and the excitation units 26*d*1 and 26*d*2 form a D-phase excitation unit.

A driving method for this arrangement will be described. Referring to FIG. 8, when currents of the same magnitudes are supplied to armature coils 24*a*1 and 24*a*2, a closed main magnetic circuit as indicated by the broken line is formed in the excitation unit 26*a*1 of one side (e.g., the movable element 29*a* side), the stator 30, and the excitation unit 26*a*2 on the other side (e.g., the movable element 29*b* side), and the movable elements 29*a* and 29*b* are stabilized. In this stable state, the magnetic attracting forces supplied from the stator 30 to the pair of excitation units 26*a*1 and 26*a*2 generate no thrust in the X direction, but generate opposite-direction attracting forces of the same magnitudes in the Y direction.

In this state, current supply to the armature coil is switched from the armature coils 24a1 and 24a2 to armature coils 24b1 and 24b2, to form a closed main magnetic circuit in an excitation unit 26b1 on one side, the stator 30, and an excitation unit 26b2 on the other side. Then, the magnetic attracting forces supplied from the stator 30 to the excitation units 26b1 and 26b2 generate a thrust in the X direction in all of the four movable element pole teeth of the excitation units 26b1 and 26b2, and opposite-direction attracting forces of the same magnitudes in the Y direction. Because of this thrust, the movable elements 29a and 29b start to move in the traveling direction from a state wherein the movable element pole teeth of the excitation units 26b and 26b2 oppose the corresponding stator pole tooth 112a to be displaced from them by P/4, to a state wherein the movable element pole teeth of the excitation units 26b1 and 26b2 face the stator pole tooth. After this, supply of the current to the armature coil is sequentially switched in the same manner to armature coils 24c1 and 24c2, 24d1 and 24d2, 24a1 and 24a2, and 24b1 and 24b2, that is, the excitation phase is sequentially switched to the C, D, A, and B phases, to give a thrust in the traveling direction to the movable elements 29a and 29b, thus moving them.

Although the 4-phase linear pulse motor having two excitation units for each phase is described above, the present invention is not limited to this. A 4-phase linear pulse motor having, in addition to the excitation unit groups 26-1 and 26-2, an excitation unit group with A, B, C, and D phases as the excitation phases to be symmetric on an X plane perpendicular to the X axis, can also be practiced. When the linear pulse motor is driven, the movable elements 29a and 29b receive Z-direction forces from magnetic attracting forces supplied from the stator 30. With this arrangement, the movable elements 29a and 29b can be driven without generating any moment, and a dynamic posture can be maintained at high precision.

Although a 4-phase linear pulse motor is described in the above embodiment, the present invention is not limited to this, and can be practiced with an n-phase linear pulse motor. In driving the linear pulse motor, the movable elements 29a and 29b may be fixed to serve as stators, and the stator 30 may be made movable in the traveling direction so it serves as a movable element. Furthermore, the support mechanism for supporting the movable element can be either one of a ball bearing, a static pressure bearing, and a magnetic bearing.

<Fourth Embodiment>

Figure 9:
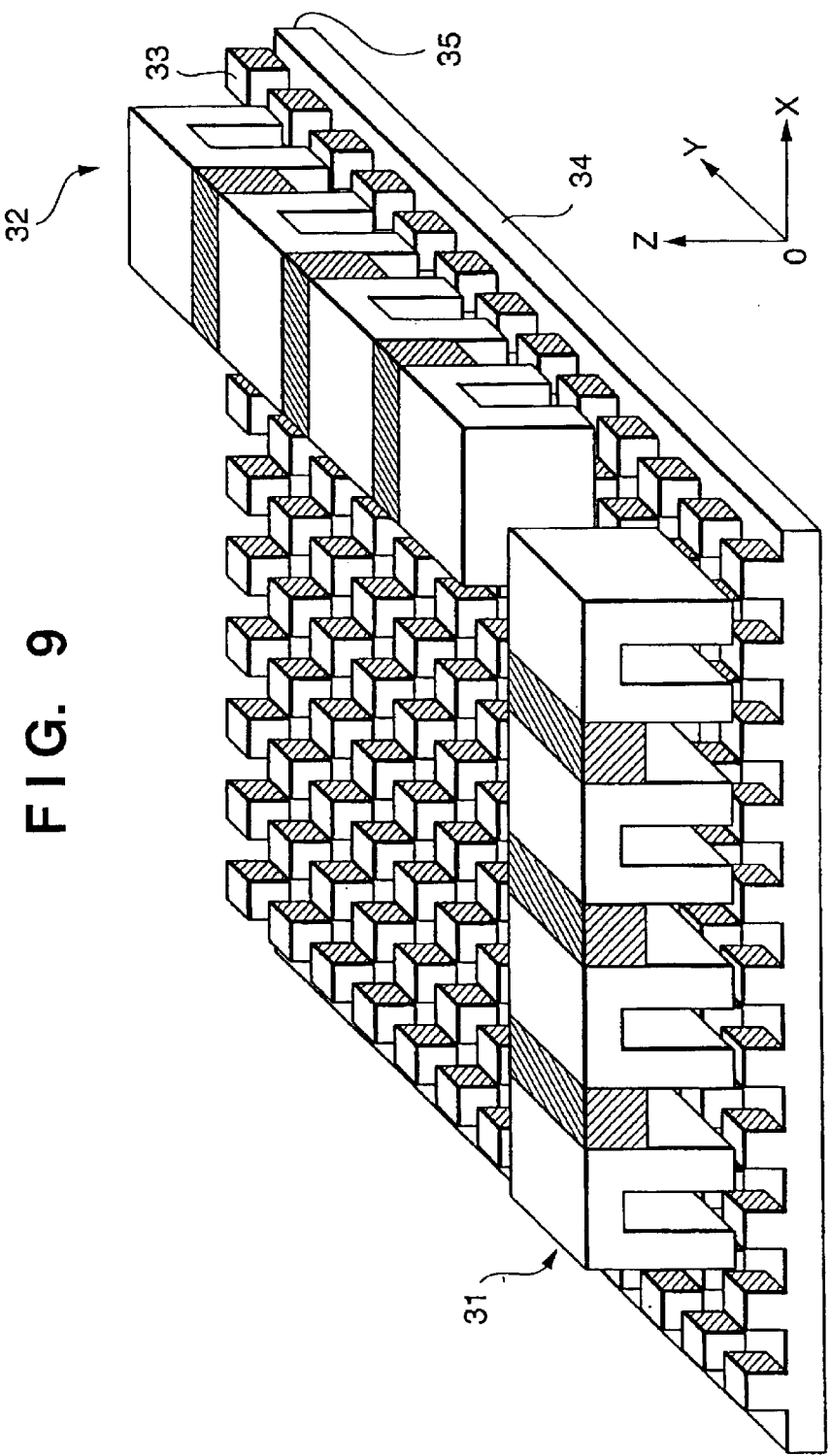
FIG. 9 is a perspective view showing the schematic arrangement of a linear pulse motor according to the fourth embodiment of the present invention.
Figure 10:
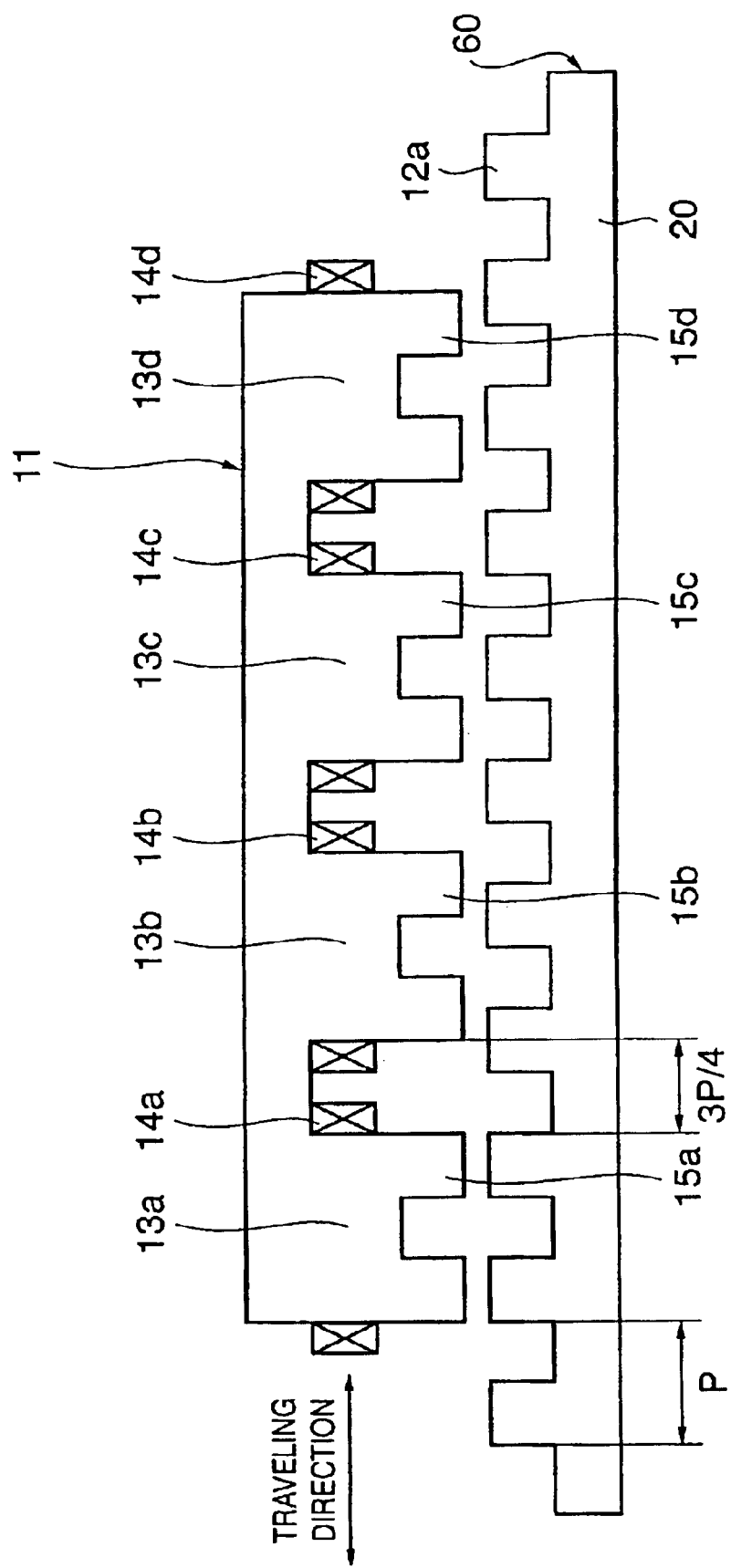
FIG. 10 is a view showing the schematic arrangement of the conventional linear pulse motor.
Figure 11A:
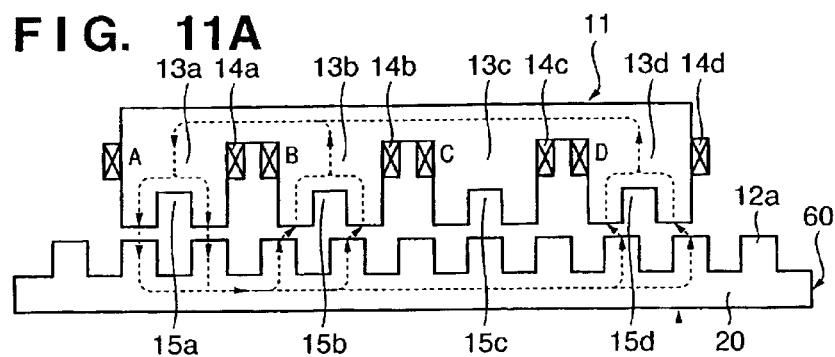
FIGS. 11A to 11C are views for explaining the basic operation of the conventional linear pulse motor.
Figure 11B:
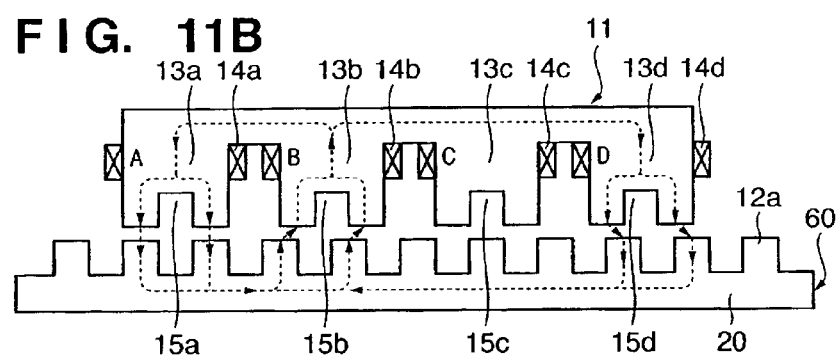
Figure 11C:
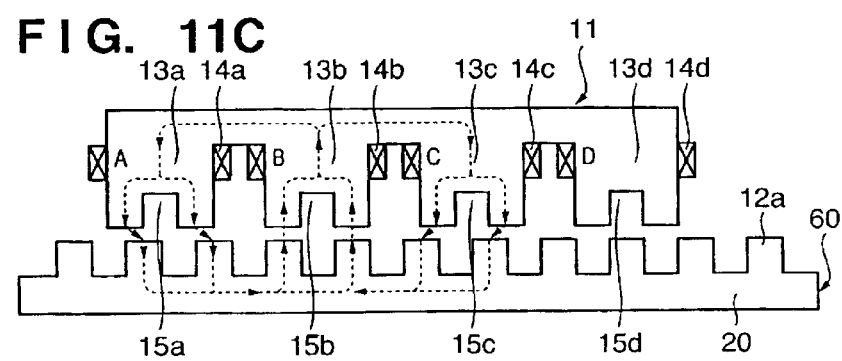

The fourth embodiment will be described with reference to FIG. 9. A 4-phase linear pulse motor according to the fourth embodiment is constituted by an X-direction movable element 31 traveling in the X direction, a Y-direction movable element 32 traveling in the Y direction, a mover for integrally connecting the X- and Y-direction movable elements 31 and 32 and capable of moving them in the X and Y directions, and a platen 35 having a plurality of projecting stator pole teeth 33 made of magnetic bodies lined up in the X and Y directions at a predetermined gap from the bottom surface of the mover and a stator yoke 34 for connecting the plurality of stator pole teeth 33 to each other. The mover is supported by a support mechanism (not shown) to be movable in the X and Y directions. The arrangements of the X- and Y-direction movable elements 31 and 32 are identical to that of the movable element 118 of the second embodiment described above. The X-direction movable element 31 has X-direction A-, B-, C-, and D-phase excitation units. The Y-direction movable element 32 has Y-direction A-, B-, C-, and D-phase excitation units. The X- and Y-direction movable elements 31 and 32 are driven in the same manner as in the movable element 118 of the second embodiment described above. The X- and Y-direction movable elements 31 and 32 can generate thrusts in the X and Y directions by exciting their A-, B-, C-, and D-phase excitation units in accordance with a predetermined order. Thus, the mover can move in the X and Y directions.

Although a 4-phase linear pulse motor is described in the above embodiment, the present invention is not limited to this, and can be practiced with an n-phase linear pulse motor. The mover can have a plurality of X-direction movable elements and a plurality of Y-direction movable elements. Furthermore, the support mechanism for supporting the mover can be either one of a ball bearing, a static pressure bearing, and a magnetic bearing.

<Embodiment of Semiconductor Manufacturing System>

An example of a manufacturing system for a semiconductor device (a semiconductor chip such as an IC or LSI, a liquid crystal panel, a CCD, a thin film magnetic head, a micromachine, and the like) by using an apparatus with a linear pulse motor according to the present invention will be described. With this manufacturing system, maintenance and services such as trouble shooting, periodical maintenance, or providing software for a manufacturing apparatus installed at a semiconductor manufacturing factory are performed by utilizing a computer network outside the manufacturing factory.

Figure 12:
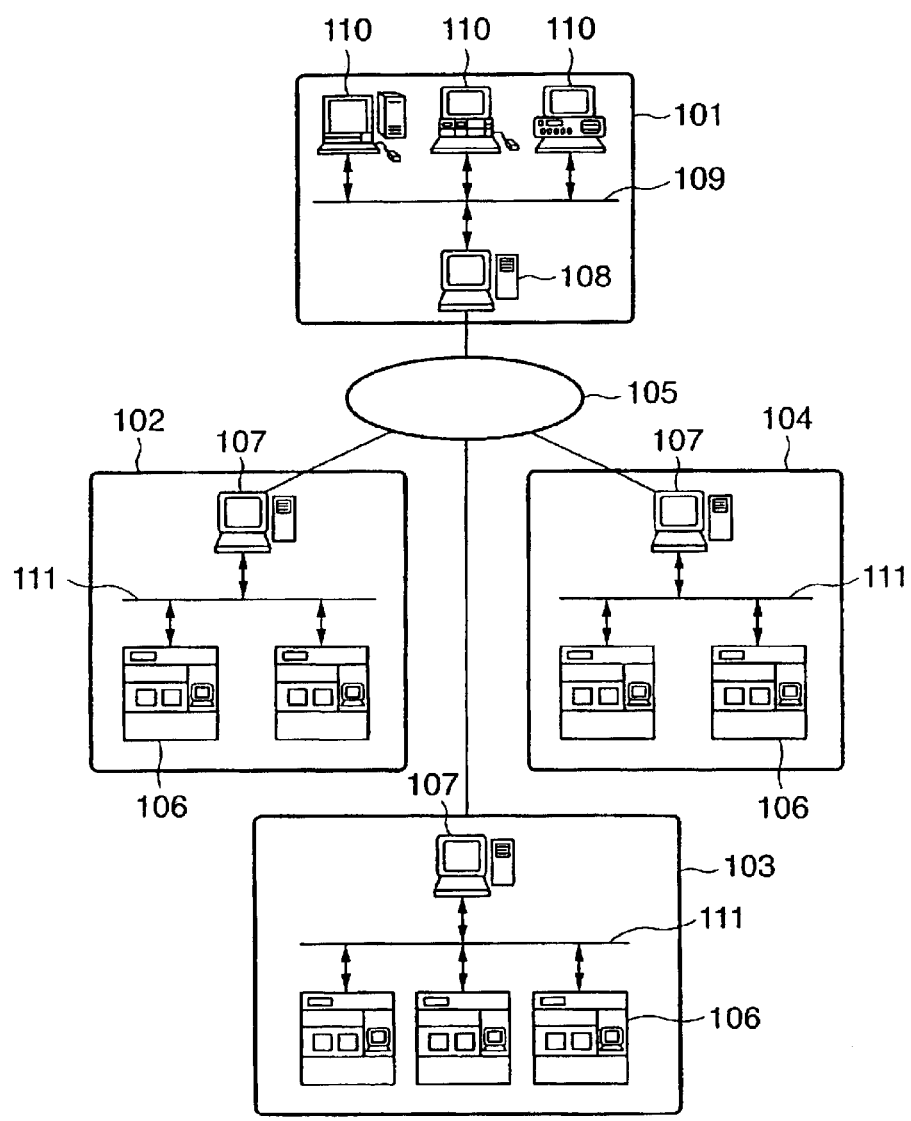
FIG. 12 is an illustration of a semiconductor device manufacturing system using an apparatus with a linear pulse motor according to the present invention seen from a certain angle.

FIG. 12 expresses the entire system seen from a certain angle. Referring to FIG. 12, reference numeral 101 denotes a business office of a vender (apparatus supplier) which provides a semiconductor device manufacturing apparatus. An example of the manufacturing apparatus includes, e.g., semiconductor manufacturing apparatuses for various types of processes used in a semiconductor manufacturing factory, e.g., a pre-process device (a lithography apparatus such as an exposure apparatus, resist processing apparatus, and etching apparatus, a heat-treating apparatus, a film forming apparatus, a planarizing apparatus, and the like) or a post-processing device (assembling apparatus, inspection apparatus, and the like). The business office 101 has a host management system 108 for providing a maintenance database for the manufacturing apparatus, a plurality of operation terminal computers 110, and a local area network (LAN) 109 which connects the host management system 108 and operation terminal computers 110 to make up an intranet or the like. The host management system 108 has a gateway for connecting the LAN 109 to the Internet 105 as a network outside the business office, and a security function of limiting an external access.

Reference numerals 102 to 104 denote manufacturing factories of the semiconductor manufacturer as the user of the manufacturing apparatus. The manufacturing factories 102 to 104 may be factories belonging to different manufacturers, or factories (for example, a pre-processing factory, a post-processing factory, and the like) belonging to one manufacturer. Each of the factories 102 to 104 has a plurality of manufacturing apparatuses 106, a local area network (LAN) 111 for connecting the manufacturing apparatuses 106 to make up an intranet or the like, and a host management system 107 serving as a monitoring unit for monitoring the operating states of the respective manufacturing apparatuses 106. The host management system 107 provided in each of the factories 102 to 104 has a gateway for connecting the LAN 111 in each factory to the Internet 105 as a network outside the factory. Thus, the LAN 111 of each factory can access the host management system 108 of the business office 101 of the vender through the Internet 105. Access by only those users limited by the security function of the host management system 108 is allowed. More specifically, the factory informs the vender of status information (e.g., the symptom of a manufacturing apparatus with a trouble) indicating the operating state of each manufacturing apparatus 106 through the Internet 105. The factory can receive response information (e.g., information designating a remedy against a trouble, or remedy software or data) regarding this notice, and maintenance information such as update software or help information from the vender through the Internet 105. Data communication between the factories 102 and 104 and the vender 101 and that in the LANs 111 of the respective factories are done using a communication protocol (TCP/IP) generally used in the Internet. In place of utilizing the Internet as a network outside the factory, a high-security dedicated line network (e.g., ISDN) that does not allow access by a third party may be utilized. The host management system is not limited to one provided by the vender. The user may make up a database and place it on an external network, and the plurality of factories of the user may be allowed to access the database.

Figure 13:
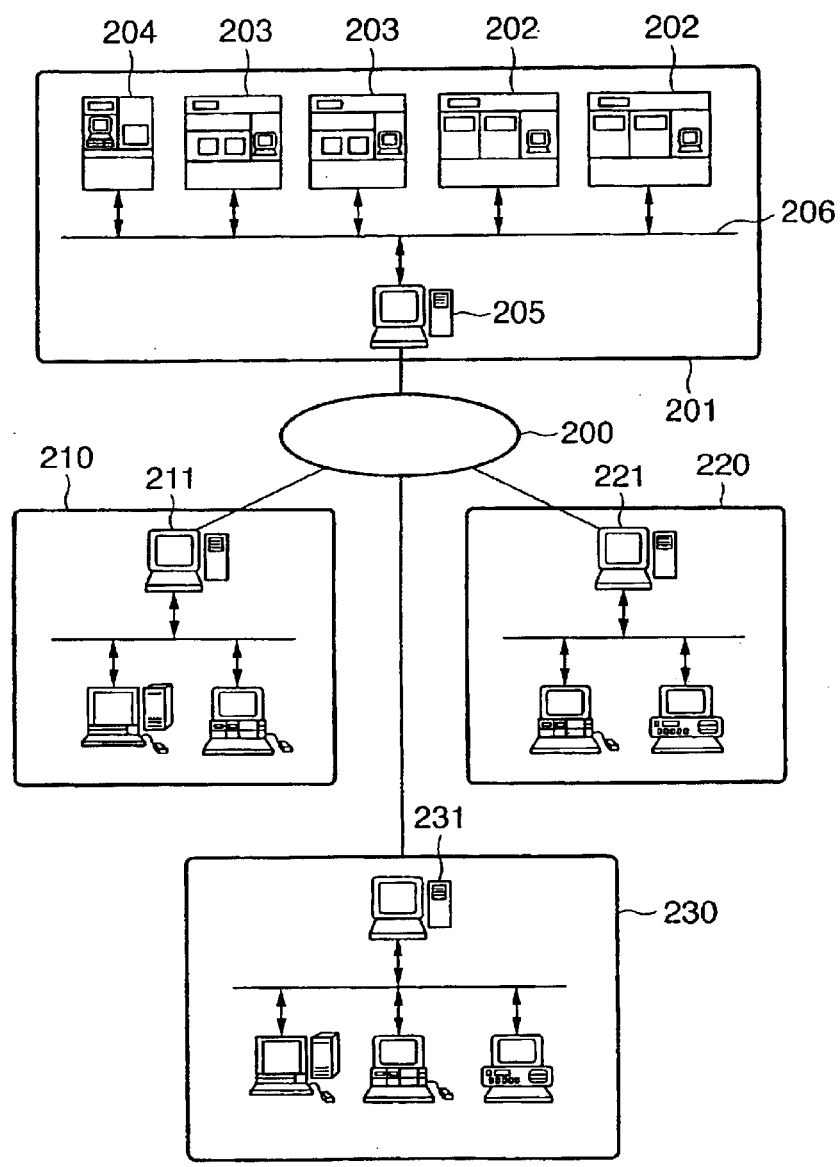
FIG. 13 is an illustration of the semiconductor device manufacturing system using the apparatus according to the present invention seen from another angle.

FIG. 13 is an illustration expressing the entire system of this embodiment seen from an angle different from that of FIG. 12. In the aforementioned example, the plurality of user factories each having the manufacturing apparatuses, and the management system of the vender of the manufacturing apparatuses are connected to each other through an external network. Information on production management of each factory and at least one manufacturing apparatus are data-communicated through the external network. In contrast to this, in this example, factories each having manufacturing apparatuses of a plurality of venders, and the management systems of the respective venders of the plurality of manufacturing apparatuses are connected to each other through an external network outside the factories. The maintenance information on the respective manufacturing apparatuses are data-communicated through the external network. Referring to FIG. 13, reference numeral 201 denotes a manufacturing factory of a manufacturing apparatus user (semiconductor device manufacturer). Manufacturing apparatuses for performing various types of processes, e.g., an exposure apparatus 202, a resist processing apparatus 203, and a film formation processing apparatus 204 are introduced to the manufacturing line of the factory. Although only one manufacturing factory 201 is illustrated in FIG. 13, in fact, a plurality of factories form a network in this manner. The apparatuses of each factory are connected to each other through a LAN 206 to make up an intranet. A host management system 205 performs the operation management of the manufacturing line.

Each business office of the venders (apparatus suppliers), e.g., an exposure apparatus manufacturer 210, resist processing apparatus manufacturer 220, or film formation apparatus manufacturer 230, has a host management system 211, 221, or 231 for remote-control maintenance of the devices that the users supplied. The host management system has a maintenance database and a gateway to an external network, as described above. The host management system 205 for managing the respective apparatuses in the manufacturing factory of the user and the management systems 211, 221, and 231 of the venders of the respective apparatuses are connected to each other through the Internet as an external network 200, or a dedicated line network. In this system, when a trouble occurs in any one of a series of manufacturing devices of the manufacturing line, the manufacturing line stops operation. However, this situation can be quickly coped with by receiving remote-control maintenance from the vender of the device where the trouble occurs through the Internet 200. Downtime of the manufacturing line can thus be minimized.

Each manufacturing apparatus set in the semiconductor manufacturing factory has a display, a network interface, and a computer for performing network access software and apparatus operating software stored in a storage. For example, the storage is a stored memory, hard disk, or network file server. The network access software includes a dedicated or general web browser, and provides a user interface, an example of which is shown in, e.g., FIG. 14, on the display. The operator who manages the manufacturing apparatus in each factory inputs information such as the type of manufacturing apparatus 401, serial number 402, subject of trouble 403, occurrence date 404, degree of urgency 405, symptom 406, remedy 407, progress 408, and the like in the enter boxes on the display by referring to the display. The input information is transmitted to the maintenance database through the Internet. Appropriate maintenance information corresponding to the transmitted information is sent back from the maintenance database and shown on the display. The user interface provided by the web browser realizes hyperlink functions 410 to 412, as shown in FIG. 14. Thus, the operator can access further detailed information of each item, and download update software to be used for the manufacturing apparatus or operation guide (help information) for reference by the factory operator from the software library of the vender. The maintenance information provided by the maintenance database also includes information concerning the present invention described above. The software library also provides update software that realizes the present invention.

Figure 15:
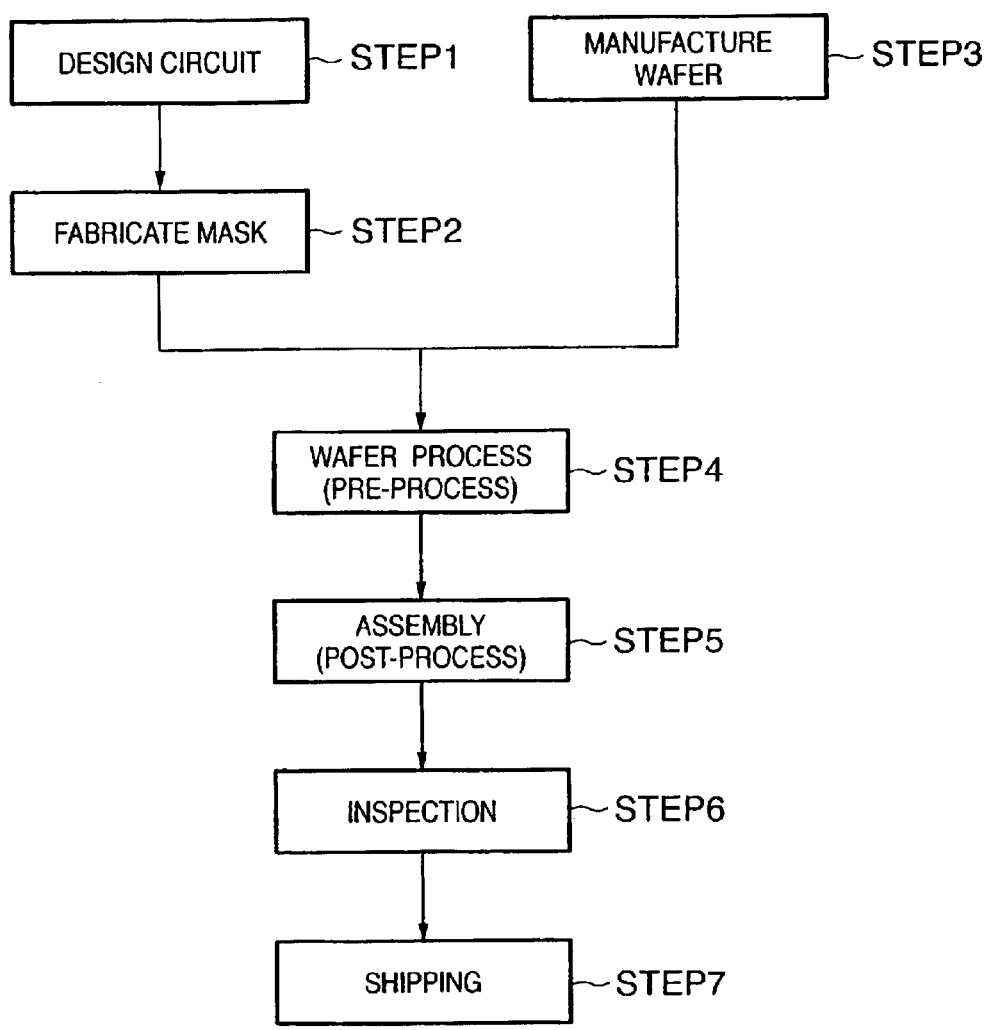
FIG. 15 is a flow chart for describing the flow of a device manufacturing process.

A semiconductor device manufacturing process utilizing the above manufacturing system will now be described. FIG. 15 shows the flow of an overall semiconductor device manufacturing process. In step 1 (design circuit), a semiconductor device circuit is designed. In step 2 (fabricate mask), a mask on which the designed circuit pattern is formed is fabricated. In step 3 (manufacture wafer), a wafer is manufactured by using a material such as silicon. In step 4 (wafer process) called a pre-process, an actual circuit is formed on the wafer by lithography using the prepared mask and wafer. In step 5 (assembly) called a post-process, a semiconductor chip is formed by using the wafer fabricated in step 4, and includes processes such as an assembly process (dicing and bonding) and packaging process (chip encapsulation). In step 6 (inspection), inspections such as the operation confirmation test and durability test of the semiconductor device manufactured in step 5 are conducted. After these steps, the semiconductor device is completed, and shipped (step 7). The pre-process and post-process are performed at different dedicated factories, and maintenance for these processes is performed in units of factories by the remote-control maintenance system described above. Information on production management and apparatus maintenance is data-communicated between the pre-process factory and post-process factory through the Internet or dedicated line network.

Figure 16:
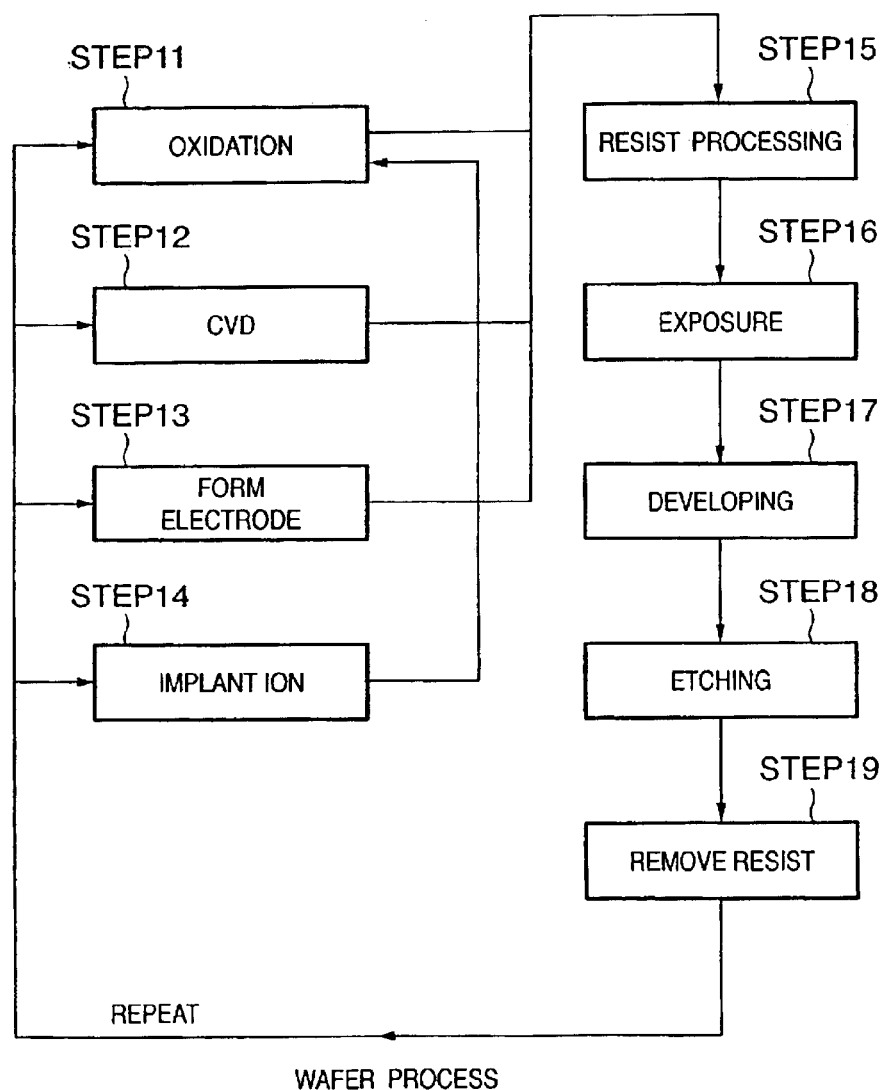
FIG. 16 is a flow chart for describing the wafer process.

FIG. 16 shows the detailed flow of the wafer process. In step 11 (oxidation), the surface of the wafer is oxidized. In step 12 (CVD), an insulating film is formed on the wafer surface. In step 13 (form electrode), an electrode is formed on the wafer by vapor deposition. In step 14 (implant ion), ions are implanted in the wafer. In step 15 (resist processing), a photosensitive agent is applied to the wafer. In step 16 (exposure), the above-mentioned exposure apparatus exposes the circuit pattern of the mask to the wafer. In step 17 (developing), the exposed wafer is developed. In step 18 (etching), the resist is etched except for the developed resist image. In step 19 (remove resist), an unnecessary resist after etching is removed. These steps are repeated to form multiple circuit patterns on the wafer. As the maintenance of the manufacturing devices used in the respective steps is performed by the remote-control maintenance system described above, troubles are prevented. Even if a trouble should occur, it can be coped with, and the normal operating condition is restored quickly. The semiconductor device productivity can thus be improved to be higher than that in the prior art.

As has been described above, in the arrangement of a variable reactance linear pulse motor, both magnetic and nonmagnetic portions are employed to improve the magnetic circuit. Thus, the magnetic flux flowing through the air gap between the movable element and stator can be utilized effectively, and an increase in thrust and efficiency of the linear pulse motor can be realized.

As many apparently widely different embodiments of the present invention can be made without departing from the spirit and scope thereof, it is to be understood that the invention is not limited to the specific embodiments thereof except as defined in the claims.

What is claimed is:

1. A linear pulse motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from said primary pole teeth with a secondary magnetic portion, said coil being energized to move said primary and secondary members relative to each other in one direction, wherein a first primary pole tooth, a second primary pole tooth located to be relatively displaced from said first primary pole tooth by a pitch P in one direction, a first primary magnetic portion for connecting said first and second primary pole teeth to each other, and a coil wound on said first primary magnetic portion make up an excitation unit, said primary member having a group of excitation units including n excitation units arranged to be relatively displaced from each other by P/n in one direction where n is an integer of not less than 3, said primary and secondary members are supported to be movable relative to each other in one direction, and said n excitation units are connected to each other with nonmagnetic portions.

2. The motor according to claim 1, wherein n=3, and said primary member has a group of excitation units including three excitation units arranged to be relatively displaced from each other by P/3 in one direction.

3. The motor according to claim 1, wherein n=4, and said primary member has a group of excitation units including four excitation units arranged to be relatively displaced from each other by P/4 in one direction.

4. The motor according to claim 1, wherein a nonmagnetic portion of said primary member is either one of stainless steel, aluminum, and a ceramic material.

5. The motor according to claim 1, comprising cooling means for cooling said coil.

6. The motor according to claim 5, wherein said cooling means cools said secondary member.

7. The motor according to claim 1, wherein magnetic portions used by said primary and secondary members are laminated electromagnetic steel plates.

8. A motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from said primary pole teeth with a secondary magnetic portion, said coil being energized to move said primary and secondary members relative to each other in one direction, wherein a first secondary pole tooth, a second secondary pole tooth located to be relatively displaced from said first secondary pole tooth by a pitch P in one direction, and a first secondary magnetic portion for connecting said first and second secondary pole teeth to each other make up a pole tooth unit, said secondary member having a group of pole tooth units including n pole tooth units arranged to be relatively displaced from each other by P/n in one direction where n is an integer of not less than 3, and said primary and secondary members are supported to be movable relative to each other in one direction.

9. The motor according to claim 8, wherein said n pole tooth units are connected to each other with nonmagnetic portions.

10. The motor according to claim 8, wherein n=3, and said secondary member has a group of pole tooth units including three pole tooth units arranged to be relatively displaced from each other by P/3 in one direction.

11. The motor according to claim 8, wherein n=4, and said secondary member has a pole tooth unit including four pole tooth units arranged to be relatively displaced from each other by P/4 in one direction.

12. The motor according to claim 8, wherein a nonmagnetic portion of said secondary member is either one of stainless steel, aluminum, and a ceramic material.

13. The linear pulse motor according to claim 8, wherein magnetic portions used by said primary and secondary members are laminated electromagnetic steel plates.

14. A stage apparatus comprising:

a control unit for generating a driving control command for a driving element; and a linear pulse motor for driving a stage on the basis of the driving control command generated by said control unit, said linear motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from said primary pole teeth with a secondary magnetic portion, said coil being energized to move said primary and secondary members relative to each other in one direction, wherein a first primary pole tooth, a second primary pole tooth located to be relatively displaced from said first primary pole tooth by a pitch P in one direction, a first primary magnetic portion for connecting said first and second primary pole teeth to each other, and a coil wound on said first primary magnetic portion make up an excitation unit, said primary member having a group of excitation units including n excitation units arranged to be relatively displaced from each other by P/n in one direction where n is an integer of not less than 3, said primary and secondary members are supported to be movable relative to each other in one direction, and said n excitation units are connected to each other with nonmagnetic portions.

15. A stage apparatus comprising:
a control unit for generating a driving control command for a driving element; and
a linear pulse motor for driving a stage on the basis of the driving control command generated by said control unit,
said linear pulse motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from said primary pole teeth with a secondary magnetic portion, said coil being energized to move said primary and secondary members relative to each other in one direction,
wherein a first secondary pole tooth, a second secondary pole tooth located to be relatively displaced from said first secondary pole tooth by a pitch P in one direction, and
a first secondary magnetic portion for connecting said first and second secondary pole teeth to each other make up a pole tooth unit, said secondary member having a group of pole tooth units including n pole tooth units arranged to be relatively displaced from each other by P/n in one direction where n is an integer of not less than 3,
said primary and secondary members are supported to be movable relative to each other in one direction, and
said n excitation units are connected to each other with nonmagnetic portions.

16. An exposure apparatus comprising a stage apparatus for mounting a wafer thereon and positioning the wafer at an exposure position,
said stage apparatus comprising
a control unit for generating a driving control command for a driving element, and
a linear pulse motor for driving a stage on the basis of the driving control command generated by said control unit,
said linear motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from said primary pole teeth with a secondary magnetic portion, said coil being energized to move said primary and secondary members relative to each other in one direction,
wherein a first primary pole tooth, a second primary pole tooth located to be relatively displaced from said first primary pole tooth by a pitch P in one direction,
a first primary magnetic portion for connecting said first and second primary pole teeth to each other, and a coil wound on said first primary magnetic portion make up an excitation unit, said primary member having a group of excitation units including n excitation units arranged to be relatively displaced from each other by P/n in one direction where n is an integer of not less than 3,
said primary and secondary members are supported to be movable relative to each other in one direction, and
said n excitation units are connected to each other with nonmagnetic portions.

17. The apparatus according to claim 16, further comprising:
an interface to be connected to a network;
a computer for executing network software that data-communicates maintenance information on said exposure apparatus through said network; and
a display for displaying the maintenance information on said exposure apparatus communicated by the network software executed by said computer.

18. The apparatus according to claim 17, wherein the network software provides a user interface, connected to an external network outside a factory where said exposure apparatus is set and for allowing access to a maintenance database provided by a vender or user of said exposure apparatus, on said display, thereby enabling information to be obtained from the database through the external network.

19. An exposure apparatus comprising a stage apparatus for mounting a wafer thereon and positioning the wafer at an exposure position,
said stage apparatus comprising
a control unit for generating a driving control command for a driving element, and
a linear pulse motor for driving a stage on the basis of the driving control command generated by said control unit,
said linear pulse motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from said primary pole teeth with a secondary magnetic portion, said coil being energized to move said primary and secondary members relative to each other in one direction,
wherein a first secondary pole tooth, a second secondary pole tooth located to be relatively displaced from said first secondary pole tooth by a pitch P in one direction, and
a first secondary magnetic portion for connecting said first and second secondary pole teeth to each other make up a pole tooth unit, said secondary member having a group of pole tooth units including n pole tooth units arranged to be relatively displaced from each other by P/n in one direction where n is an integer of not less than 3, and
said primary and secondary members are supported to be movable relative to each other in one direction.

20. The apparatus according to claim 19, further comprising:
an interface to be connected to a network;
a computer for executing network software that data-communicates maintenance information on said exposure apparatus through said network; and
a display for displaying the maintenance information on said exposure apparatus communicated by the network software executed by said computer.

21. The apparatus according to claim 20, wherein the network software provides a user interface which is connected to an external network outside a factory where said exposure apparatus is set and allows access to a maintenance database provided by a vender or user of said exposure apparatus, on said display, thereby enabling information to be obtained from the database through the external network.

22. A semiconductor device manufacturing method comprising the steps of:
  setting a group of manufacturing apparatuses for various types of processes including an exposure apparatus at a semiconductor manufacturing factory; and
  manufacturing a semiconductor device in accordance with a plurality of processes using the group of manufacturing apparatuses,
  the exposure apparatus comprising a stage apparatus for mounting a wafer thereon and positioning the wafer at an exposure position,
  the stage apparatus comprising
  a control unit for generating a driving control command for a driving element, and
  a linear pulse motor for driving a stage on the basis of the driving control command generated by the control unit,
  the linear pulse motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from the primary pole teeth with a secondary magnetic portion, the coil being energized to move the primary and secondary members relative to each other in one direction,
  wherein a first primary pole tooth, a second primary pole tooth located to be relatively displaced from the first primary pole tooth by a pitch P in one direction,
  a first primary magnetic portion for connecting the first and second primary pole teeth to each other, and a coil wound on the first primary magnetic portion make up an excitation unit, the primary member having a group of excitation units including n excitation units arranged to relatively displaced from each other by P/n in one direction where n is an integer of not less than 3,
  the primary and secondary members are supported to be movable relative to each other in one direction, and
  said n excitation units are connected to each other with nonmagnetic portions.

23. The method according to claim 22, further comprising the steps of:
  connecting the group of manufacturing apparatuses through a local area network;
  connecting the local area network and an external network outside the semiconductor manufacturing factory;
  data-communicating information on at least one of the group of manufacturing apparatuses from a database on the external network by utilizing the local area network and the external network; and
  controlling the exposure apparatus on the basis of the communicated information.

24. The method according to claim 23, wherein maintenance information on the manufacturing apparatus is obtained by data communication by accessing a database provided by a vender or user of the exposure apparatus through the external network, or production management is performed by data communication with another semiconductor manufacturing factory through the external network.

25. A semiconductor device manufacturing method comprising the steps of:
  setting a group of manufacturing apparatuses for various types of processes including an exposure apparatus at a semiconductor manufacturing factory; and
  manufacturing a semiconductor device in accordance with a plurality of processes using the group of manufacturing apparatuses,
  the exposure apparatus comprising a stage apparatus for mounting a wafer thereon and positioning the wafer at an exposure position,
  the stage apparatus comprising
  a control unit for generating a driving control command for a driving element, and
  a linear pulse motor for driving a stage on the basis of the driving control command generated by the control unit,
  the linear pulse motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap frm the primary pole teeth with a secondary magnetic portion, the coil being energized to move said primary and secondary members relative to each other in one direction,
  wherein a first secondary pole tooth, a second secondary pole tooth located to be relatively displaced from the first secondary pole tooth by a pitch P in one direction, and
  a first secondary magnetic portion for connecting the first and second secondary pole teeth to each other make up a pole tooth unit, the secondary member having a group of pole tooth units including n pole tooth units arranged to be relatively displaced from each other by P/n in one direction where n is an integer of not less than 3, and
  the primary and secondary members are supported to be movable relative to each other in one direction.

26. The method according to claim 25, further having the steps of:
  connecting the group of manufacturing apparatuses through a local area network;
  connecting the local area network and an external network outside the semiconductor manufacturing factory;
  data-communicating information on at least one of the group of manufacturing apparatuses from a database on the external network by utilizing the local area network and the external network; and
  controlling the exposure apparatus on the basis of the communicated information.

27. The method according to claim 26, wherein maintenance information on the manufacturing apparatus is obtained by data communication by accessing a database provided by a vender or user of the exposure apparatus through the external network, or production management is performed by data communication with another semiconductor manufacturing factory through the external network.

28. A semiconductor manufacturing factory having
  a group of manufacturing apparatuses for various types of processes including an exposure apparatus,
  a local area network for connecting said group of manufacturing apparatuses, and
  a gateway for connecting said local area network and an external network outside the semiconductor manufacturing factory to allow information on at least one of said group of manufacturing apparatuses to data-communicate,
  said exposure apparatus comprising a stage apparatus for mounting a wafer thereon and positioning the wafer at an exposure position, said stage apparatus comprising
a control unit for generating a driving control command for a driving element, and
a linear pulse motor for driving a stage on the basis of the driving control command generated by said control unit,
said linear pulse motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from said primary pole teeth with a secondary magnetic portion, said coil being energized to move said primary and secondary members relative to each other in one direction,
wherein a first primary pole tooth, a second primary pole tooth located to be relatively displaced from said primary pole tooth by a pitch P in one direction,
a first primary magnetic portion for connecting said first and second primary pole teeth to each other, and a coil wound on said first primary magnetic portion make up an excitation unit, said primary member having a group of excitation units including n excitation units arranged to be relatively displaced from each other by P/n in one direction where n is an integer of not less than 3,
said primary and secondary members are supported to be movable relative to each other in one direction, and
said n excitation units are connected to each other with nonmagnetic portions.

29. A semiconductor manufacturing factory having
a group of manufacturing apparatuses for various types of processes including an exposure apparatus,
a local area network for connecting said group of manufacturing apparatuses, and
a gateway for connecting said local area network and an external network outside the semiconductor manufacturing factory to allow information on at least one of said group of manufacturing apparatuses to data-communicate,
said exposure apparatus comprising a stage apparatus for mounting a wafer thereon and positioning the wafer at an exposure position,
said stage apparatus comprising
a control unit for generating a driving control command for a driving element, and
a linear pulse motor for driving a stage on the basis of the driving control command generated by said control unit,
said linear pulse motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from said primary pole teeth with a secondary magnetic portion, said coil being energized to move said primary and secondary members relative to each other in one direction,
wherein a first secondary pole tooth, a second secondary pole tooth located to be relatively displaced from said first secondary pole tooth by a pitch P in one direction, and
a first secondary magnetic portion for connecting said first and second secondary pole teeth to each other make up a pole tooth unit, said secondary member having a group of pole tooth units including n pole tooth units arranged to be relatively displaced from each other by P/n in one direction where n is an integer of not less than 3, and
said primary and secondary members are supported to be movable relative to each other in one direction.

30. A maintenance method for an exposure apparatus set at a semiconductor manufacturing factory, comprising the steps of:
preparing a database for accumulating information on maintenance of the exposure apparatus on an external network outside the factory where the exposure apparatus is set;
connecting the exposure apparatus to a local area network in the factory; and
maintaining the exposure apparatus on the basis of the information accumulated in the database by utilizing the external network and the local area network,
the exposure apparatus comprising a stage apparatus for mounting a wafer thereon and positioning the wafer at an exposure position,
the stage apparatus comprising
a control unit for generating a driving control command for a driving element, and
a linear pulse motor for driving a stage on the basis of the driving control command generated by the control unit,
the linear motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from the primary pole teeth with a secondary magnetic portion, the coil being energized to move the primary and secondary members relative to each other in one direction,
wherein a first primary pole tooth, a second primary pole tooth located to be relatively displaced from the first primary pole tooth by a pitch P in one direction,
a first primary magnetic portion for connecting the first and second primary pole teeth to each other, and a coil wound on the first primary magnetic portion make up an excitation unit, the primary member having a group of excitation units including n excitation units arranged to be relatively displaced from each other by P/n in one direction where n is an integer of not less than 3,
the primary and secondary members are supported to be movable relative to each other in one direction, and
said n excitation units are connected to each other with nonmagnetic portions.

31. A maintenance method for an exposure apparatus set at a semiconductor manufacturing factory, comprising the steps of:
preparing a database for accumulating information on maintenance of the exposure apparatus on an external network outside the factory where the exposure apparatus is set;
connecting the exposure apparatus to a local area network in the factory; and
maintaining the exposure apparatus on the basis of the information accumulated in the database by utilizing the external network and the local area network,
the exposure apparatus comprising a stage apparatus for mounting a wafer thereon and positioning the wafer at an exposure position, the stage apparatus comprising a control unit for generating a driving control command for a driving element, and a linear pulse motor for driving a stage on the basis of the driving control command generated by the control unit, the linear pulse motor comprising a primary member obtained by winding a coil on a primary magnetic portion that connects a plurality of projecting primary pole teeth lined up in one direction, and a secondary member obtained by connecting a plurality of projecting secondary pole teeth lined up in one direction at an air gap from the primary pole teeth with a secondary magnetic portion, the coil being energized to move the primary and secondary members relative to each other in one direction, wherein a first secondary pole tooth, a second secondary pole tooth located to be relatively displaced from the first secondary pole tooth by a pitch P in one direction, and a first secondary magnetic portion for connecting the first and second secondary pole teeth to each other make up a pole tooth unit, the secondary member having a group of pole tooth units including n pole tooth units arranged to be relatively displaced from each other by P/n in one direction where n is an integer of not less than 3, and the primary and secondary members are supported to be movable relative to each other in one direction.

32. A linear pulse motor comprising a primary member which has n excitation units, and a secondary member which has a plurality of projecting pole teeth lined up by a pitch P in one direction, said n excitation units being excited sequentially to move said primary and secondary members relative to each other in one direction, wherein each of said n excitation units comprises:

a primary pole teeth and a secondary pole teeth;

a magnetic portion for connecting said first and second primary pole teeth to each other; and a coil wound on said magnetic portion, wherein said n excitation units are connected to each other with nonmagnetic portions.

\* \* \* \* \*

UNITED STATES PATENT AND TRADEMARK OFFICE
CERTIFICATE OF CORRECTION

PATENT NO. : 6,960,846 B2
DATED : November 1, 2005
INVENTOR(S) : Shinji Uchida

It is certified that error appears in the above-identified patent and that said Letters Patent is hereby corrected as shown below:

Column 14,
Line 67, "vender" should read -- vendor --.

Column 15,
Line 33, "venders," should read -- vendors, --.
Line 34, "venders" should read -- vendors --.

Column 20,
Lines 15 and 65, "vender" should read -- vendor --.

Column 21,
Line 37, "to" should read -- to be --.

Column 22,
Line 50, "vender" should read -- vendor --.

Column 23,
Line 67, "make" should read -- to make --.

Column 25,
Line 22, "make" should read -- to make --.

Column 26,
Line 14, "a" (both occurrences) should be deleted.

Signed and Sealed this

Eleventh Day of April, 2006

JON W. DUDAS
*Director of the United States Patent and Trademark Office*